United States Patent [19]

Jensen et al.

[11] Patent Number: 4,970,460
[45] Date of Patent: Nov. 13, 1990

[54] CONTROLLED IMPEDANCE TESTSITE

[75] Inventors: Dennis Jensen, Blain; David Parkin, St. Paul, both of Minn.

[73] Assignee: Aetrium, Inc., St. Paul, Minn.

[21] Appl. No.: 104,077

[22] Filed: Oct. 5, 1987

[51] Int. Cl.[5] .................. G01R 31/26; H01R 9/09
[52] U.S. Cl. .................. 324/158 F; 324/158 P; 439/260; 439/264
[58] Field of Search .......... 324/158 F, 158 P, 73 PC; 439/260, 263, 264

[56] References Cited

U.S. PATENT DOCUMENTS

| | | | |
|---|---|---|---|
| 3,411,333 | 11/1968 | Frick et al. | 324/158 F |
| 3,701,021 | 10/1972 | Isaac et al. | 324/158 F X |
| 3,715,662 | 2/1973 | Richelmann | 324/158 F X |
| 3,805,159 | 4/1974 | Richelmann | 324/158 F X |
| 4,195,258 | 3/1980 | Yen | 324/73 AT X |
| 4,234,418 | 11/1980 | Boissicat | 209/542 X |
| 4,473,798 | 9/1984 | Cedrone | 324/158 P X |
| 4,478,352 | 10/1984 | Amundson | 209/573 X |
| 4,498,047 | 2/1985 | Hexamer | 324/158 F X |
| 4,574,235 | 3/1986 | Kelly | 324/158 F X |
| 4,588,092 | 5/1986 | Moechnig | 324/158 F X |
| 4,675,599 | 6/1987 | Jensen | 324/158 F X |
| 4,683,423 | 7/1987 | Morton | 325/158 F X |
| 4,689,556 | 8/1987 | Cedrone | 324/158 F X |
| 4,705,338 | 11/1987 | Sitzler | 439/260 X |
| 4,721,907 | 1/1988 | Dean et al. | 324/158 F X |
| 4,739,257 | 4/1988 | Jensen et al. | 324/158 F X |

FOREIGN PATENT DOCUMENTS

| | | |
|---|---|---|
| 57-158571 | 9/1982 | Japan . |
| 502526 | 4/1974 | U.S.S.R. . |
| 197708 | 8/1977 | U.S.S.R. . |
| 0528007 | 7/1978 | U.S.S.R. . |

Primary Examiner—Reinhard J. Eisenzopf
Assistant Examiner—Vinh P. Nguyen
Attorney, Agent, or Firm—Hugh D. Jaeger

[57] ABSTRACT

A controlled impedance testsite for the testing of integrated circuits, including matched impedance cables. Decoupling capacitors are used in the matched impedance cables in test situations where high frequency decoupling is required. The testsite includes a socket style ejector and a spring return. The contacts are a flat wire style affixed to the flexible Kapton matched impedance cables. A contact board and BUS board are positioned for decoupling purposes at one end of each cable adjacent to the contact area of the testsite and the integrated circuit to be tested. A hard PWB with connection pins affixed is used as a termination contact point, and is positioned at the opposing end of each flexible cable.

10 Claims, 22 Drawing Sheets

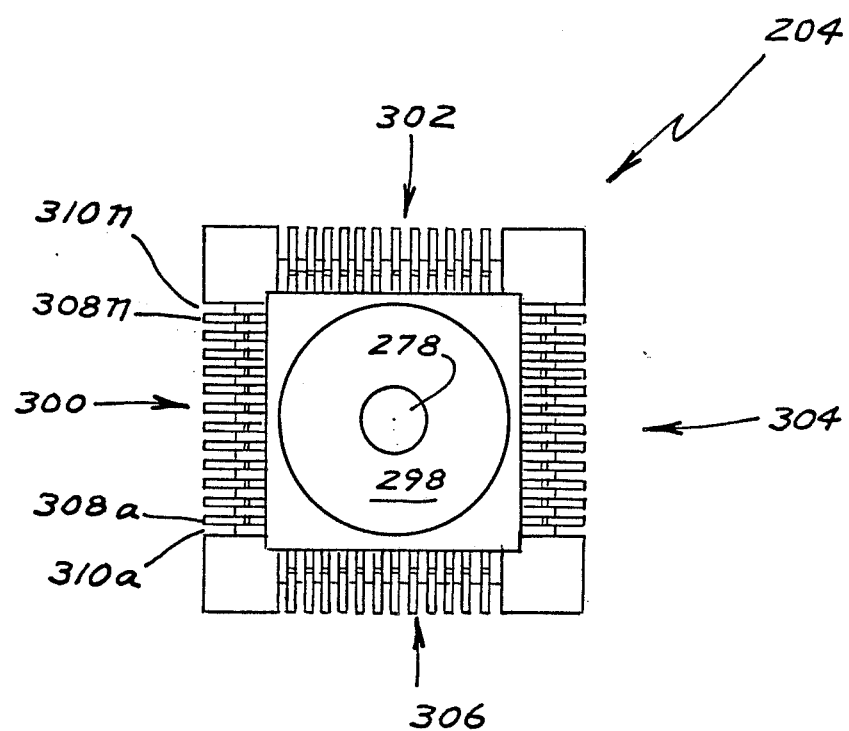
F I G. 20

CONTROLLED IMPEDANCE TESTSITE

BACKGROUND OF THE INVENTION

1. Filed of the Invention

The present invention pertains to a testsite used for evaluation of integrated circuits and, more particularly, pertains to a testsite where high frequency decoupling may be achieved by insertion of capacitors in close proximity to the actual IC being tested.

2. Description of the Prior Art

The prior art testsites have not provided reliable and linear controlled impedance testsites. It has been burdensome to control the impedance for testsites which is required for testing state-of-the-art integrated circuits, especially at 50 ohms.

The prior art testsites were not stable or noise free, and did not provide a system which could repetitively transfer electrical signals between the IC under test and the tester with minimal signal distortion. Prior art testsites did not provide the capability for installation of decoupling capacitors in such close proximity to the IC being tested.

SUMMARY OF THE INVENTION

The general purpose of the present invention is to provide a controlled impedance testsite. The controlled impedance testsite features several main components including a molded configured extender, a socket system ejector guide, a cover and controlled impedance cable assemblies. An integrated circuit is pressed downwardly into the testsite to contact spring contactors, and is ejected outwardly after testing by ejector return spring. Removable flexible multi-layer cables include an upper stiffener board with contacts, and a lower connector board with pins for connection with external test equipment. Pin decoupling, pin grounding, high voltage bypass, constant signal path length, easy contact replacement, and utilization in present IC handlers are features of the present invention.

According to one embodiment of the present invention, there is provided a controlled impedance testsite including extender, a receptacle cavity and ejector shaft proximally located in the extender, an ejector fitting within the receptacle cavity, an ejector spring over the ejector shaft, a cover over the extender holding the ejector within the receptacle cavity, and a cavity in the cover for insertion of an IC upon the ejector and within the receptacle cavity. The cover also secures an upper connector board including flexible contactors and capacitor contactors to alignment pins on the upper surface of the ejector. Flexible multilayered matched impedance cables connect from the upper connector board to the lower connector board where connector pins allow for connection with external test equipment.

One significant aspect and feature of the present invention is a controlled impedance testsite where individual pin decoupling is available in very close proximity to the flexible contact point by mounting ceramic chip capacitors on the BUS board and jumping to the contact board located at the end of the controlled impedance cable or by mounting ceramic chip capacitors on the customer interfacing board.

Another significant aspect and feature of the present invention is a controlled impedance testsite where any pin or series of pins can be grounded by a jumper wire.

Other significant aspects and features of the present invention are a controlled impedance testsite where the signal path is a constant length; a controlled impedance testsite whereby high current flows can be routed through several cable wires by wire jumpers; a controlled impedance testsite whereby different voltage distribution to different pins is possible by the use of jumper wires; a controlled impedance testsite whereby contact replacement is facilitated by the use of a plurality of readily replaceable controlled impedance cables; a controlled impedance testsite whereby the controlled impedance testsite can be mounted directly into and is compatible to present IC handling equipment; a controlled impedance testsite whereby the cover secures a contactor board, contact pins and controlled impedance cables to the testsite; a controlled impedance testsite whereby the contacts secure to the controlled impedance cables as a unit; and a controlled impedance testsite whereby operation over a large temperature range is possible.

Having thus described embodiments of the present invention, it is one of the principle objects hereof to provide a controlled impedance testsite including decoupling capacitor capability, operation over a wide temperature range, and contact replaceability.

Objects of the present invention include individual pin decoupling which is possible to within 0.20 inches of the device contact point. Any single pin or series of pins can be decoupled at the same time. Miniature, high temperature ceramic chip capacitors can be used without any modifications to the testsite. Decoupling can also be made at the end of the controlled impedance cable or on the customer interface board. Individual pin grounding is also possible. Any pin or series of pins can be grounded by simply connecting a jumper wire to the controlled impedance cable.

Pin termination is possible to terminate individual pins with resistors by using the same techniques as pin decoupling or grounding.

Constant signal path length. Every signal path is held to a tolerance of ±0.001 inch of each other, unlike some of the prior art that has signal path length variations of up to 25%.

Minimized crosstalk. Crosstalk is minimized between signal lines by using microstrip transmission line techniques.

High voltage bypass to individual pins. This is useful when the current exceeds the capacity of the signal paths. No modifications are needed as one simply connects a jumper wire to the controlled impedance cable.

Different voltages to different pins. This testsite has the advantage of having a different voltage value for each individual pin. High currents can also be used in this arrangement.

Square wave integrity is maintained. The wide bandwidth of the high performance testsite provides an accurate transfer of high speed waveforms between the device and the tester. Square waves with rise and fall times of 2ns or more, have edge speed degradation of less than 1%.

Ease of contact replacement. The contactor uses four controlled impedance cable assemblies. One cable assembly for each side of the device. Because of this, one cable can be replaced at a time.

Direct replacement for prior art testsites. The customer interface boards may be the only parts that need to be changed.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein:

FIG. 20 illustrates a top view of the ejector;

DESCRIPTION OF THE PREFERRED EMBODIMENTS

Figure 1:
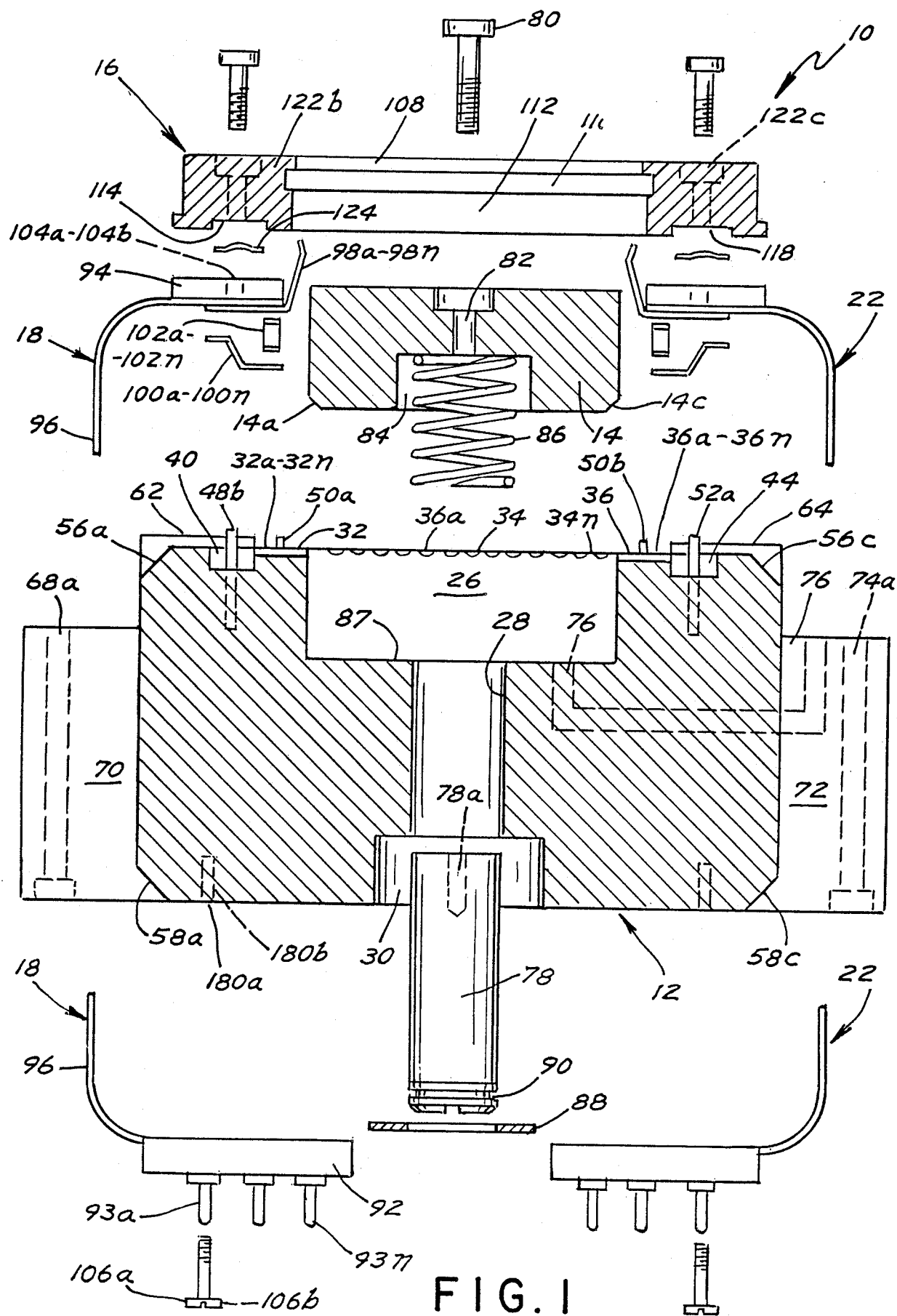
FIG. 1 illustrates an exploded view, in partial cross-section, of a controlled impedance testsite.

FIG. 1 illustrates an explOded view, in partial exploded cross section of a controlled impedance testsite 10, the present invention, including a one-piece molded configured extender 12, an ejector 14, a cover 16 and controlled impedance cable assemblies 18 and 22. These components and other described components are referred to in FIG. 1 and also illustrated in the other figures.

Figure 3:
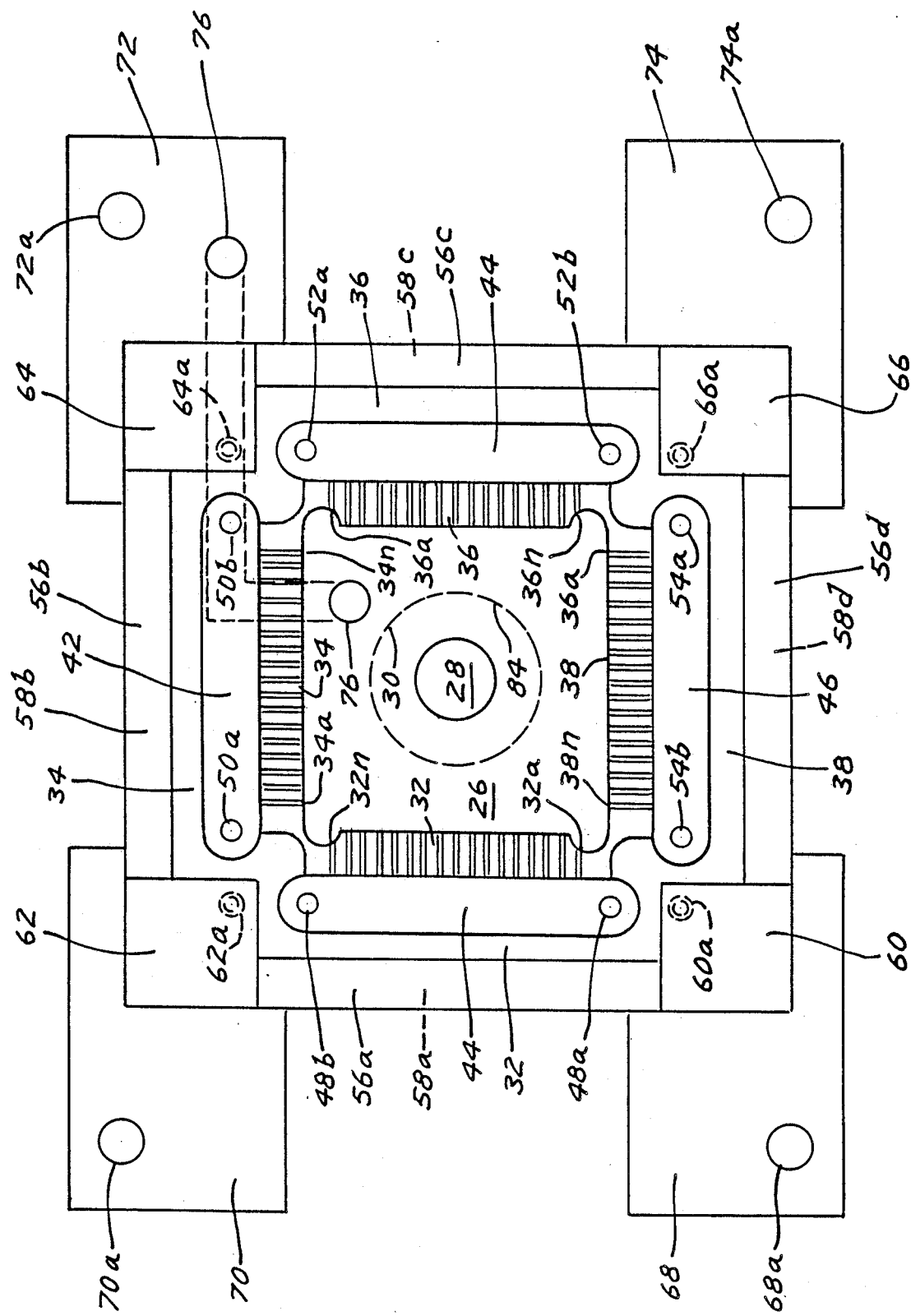
FIG. 3 illustrates a top view of the controlled impedance testsite with the ejector and top cover removed.

The configured extender body 12 includes a centrally located receptacle cavity 26. A spring shaft hole 28 centrally locates within the extender 12. A top portion of the spring shaft hole 28 positions centrally within the receptacle cavity 26, and a bottom portion positions centrally within a lower cylindrical cavity 30. Contact pin centering slot grooves 32a–32n, 34a–34n, 36a–36n, and 38a–38n, shown in FIG. 3, position in the top surfaces 32–38 of the extender body 12 for alignment with contactor pins as later described in detail. As illustrated in FIG. 3, longitudinal capacitor cavities 40, 42, 44 and 46 position adjacent to grooves 32a–32n, 34a–34n, 36a–36n, and 38a–38n, respectively, in the upper surface of the extender 12, and include alignment pins 48a, 48b, 50a, 50b, 52a, 52b, 54a and 54b, which position respectively in the capacitor cavities 40-46. Upper and lower ramped surfaces 56a–56d and 58a–58d position at the upper and lower edges, respectively, of the extender for facilitation of the controlled impedance cables 18–24, which are later described in detail. Raised mounting platforms 60–66, including threaded securement holes 60a–66a for securing of the cover 16 to the extender 12 as shown in FIG. 3, position at each of the upper outer corners of the extender 12 to provide a space for securing and positioning of the upper portions of the controlled impedance cables 18–24 beneath the cover 16. Mounting flanges 68, 70, 72, and 74 position at the lower corners of the extender 12 and include body holes 68a, 70a, 72a nd 74a, as shown in FIG. 3. A configured conditioned air channel 76 extends from the ejector receptacle cavity 26, through the extender 12, and into flange 72 for subsequent attachment to an air source for maintaining flow of conditioned air across an integrated circuit chip in the testsite 10.

Figure 2:
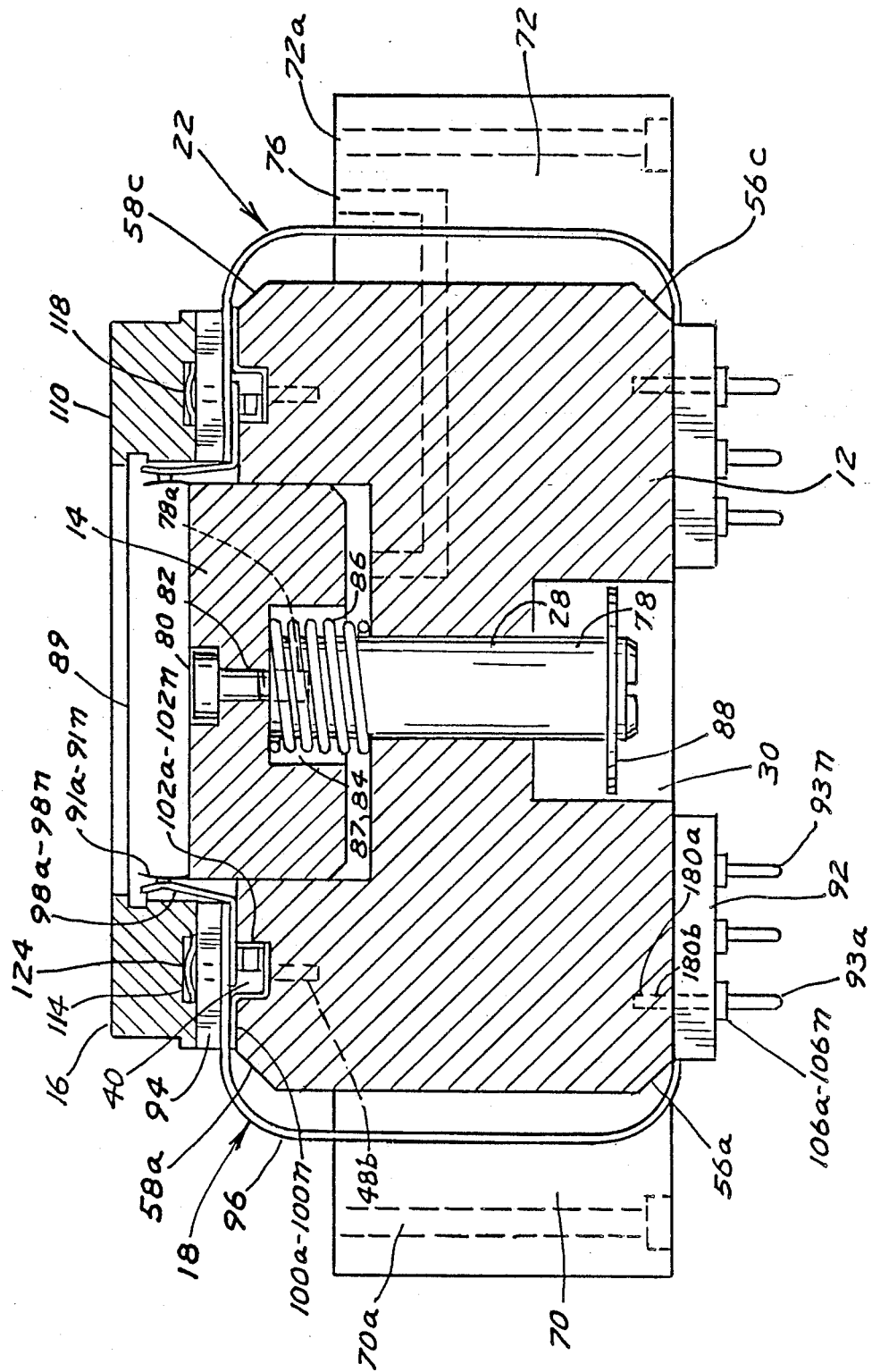
FIG. 2 illustrates a cross section of the controlled impedance testsite with a partial view of an integrated circuit chip in place and depressed for testing.

An ejector 14 includes beveled edges 14a, 14b, 14c and 14d of which like and similar bevels 14a and 14c are illustrated. The ejector 14 fits within and traverses vertically within the ejector receptacle cavity 26. A machine screw 80 extends through a hole 82 in the ejector 14 and into a threaded hole 78a in the ejector shaft 78 to secure the ejector shaft 78 to the ejector 14. The ejector shaft 78 engages in and protrudes through hole 28, and is secured as described to the ejector 14 within a cylindrical spring seat cavity 84. A spring 86 positions over the ejector shaft 78, and between the spring seat cavity 84 and a surface 87 of the extender 12 to provide spring tension against the ejector 14 for ejection of an integrated circuit chip 89 from the controlled impedance testsite 10 after it has been tested, as illustrated in FIG. 2. A retaining ring 88 positions in a groove 90 to secure the lower end of the ejector shaft 78 within the lower cylindrical cavity 30 in the extender 12.

Controlled impedance cable assemblies 18–24 position and extend about the sides of the extender from a lower connector board 92 to a upper connector board 94 and includes contactor pins at both connector boards. For sake of clarity and brevity, only one controlled impedance cable is described as the cables are like and similar.

Controlled impedance cable assembly 18 includes a phenolic lower connector board 92 including a plurality of pins 93a–93n, an upper connector board 94 and a cable assembly 96 therebetween, as later described in detail in FIGS. 5, 7, 8 and 9. A plurality of angled spring contactors 98a–98n position on the underside, as well as the edge, of the upper connector board 94 as well as a plurality of capacitor contactors 100a-100n attached thereto. A series of capacitors 102a-102n can position between spring contactors 98a-98n and corresponding capacitor contactors 100a-100n. The horizontal portions of spring contactors 98a-98n engage within grooves 32a-32n, and are brought into alignment with the extender block 12 by a series of alignment holes 104a-104b drilled through the entire connector board 94 which are placed over pins 48a-48b. The plurality of capacitors 102a-102n, including capacitor contactors 100a-100n, are accommodated within capacitor cavity 40 as illustrated in FIG. 2. The lower connector board 92 is secured to the extender 12 by screws 106a and 106b. The upper connection board 94, and associated components, secure beneath cover 16, on top of extender block 12, over and within the area of the cavity 40, and between raised mounting platforms 60 and 62.

Figure 4:
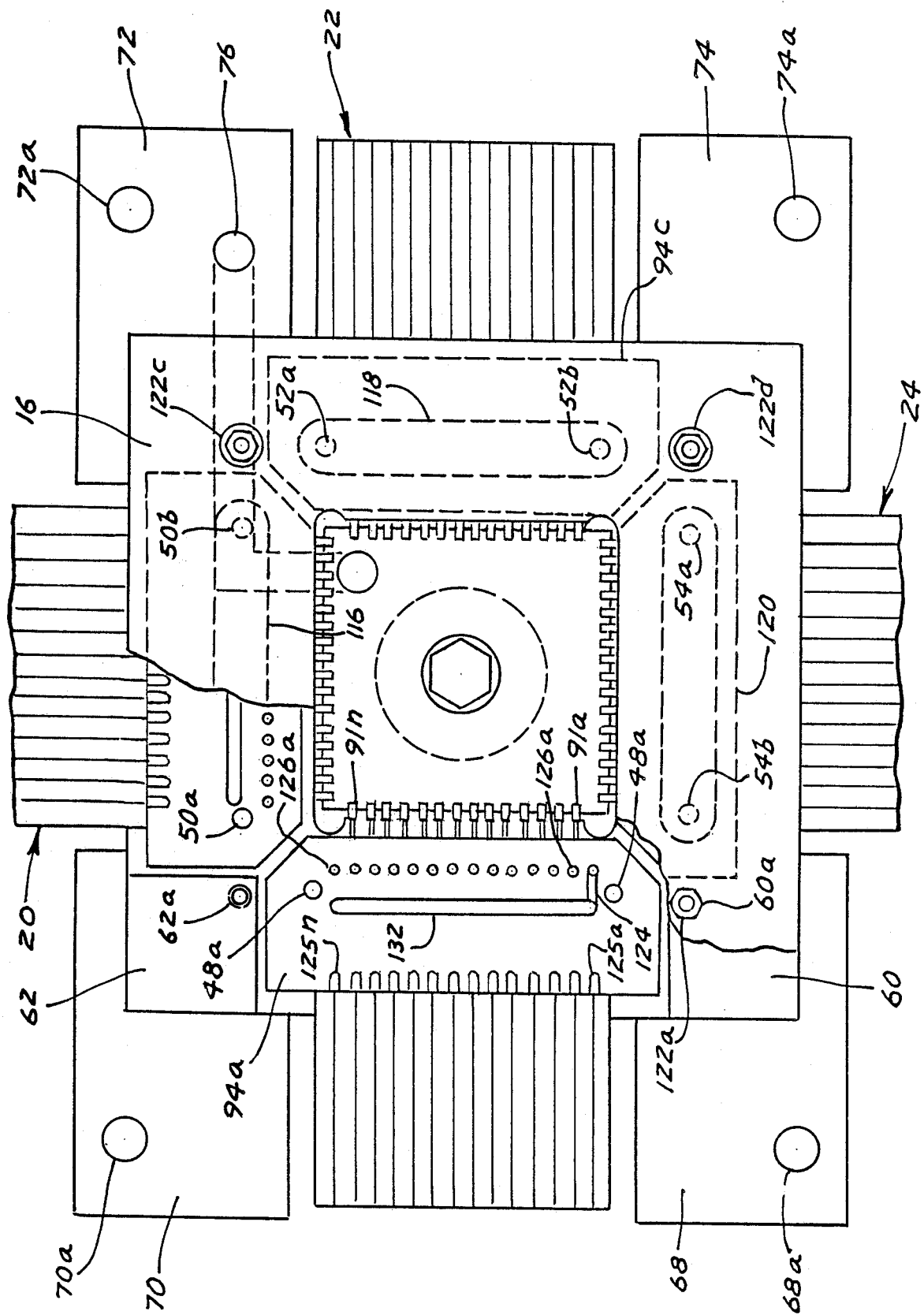
FIG. 4 illustrates a top view of the controlled impedance testsite with the ejector and top cover and a partial view of the integrated circuit chip in place and depressed for test.

A top cover 16 includes a top cavity 108, a four sided pin top groove 110, a lower central cavity 112, similar wire jumper cavities 114, 116, 118 and 120 on the under surface as also illustrated in dashed lines in FIG. 4, which co-locate with capacitor cavities 40-46, and securement holes 122a-122d. A typical jumper pin 124, by way of example and for purposes of illustration only, is shown for various interconnections of wire sets or pairs on the top surface contacts of the upper connector board 94a.

Figure 5:
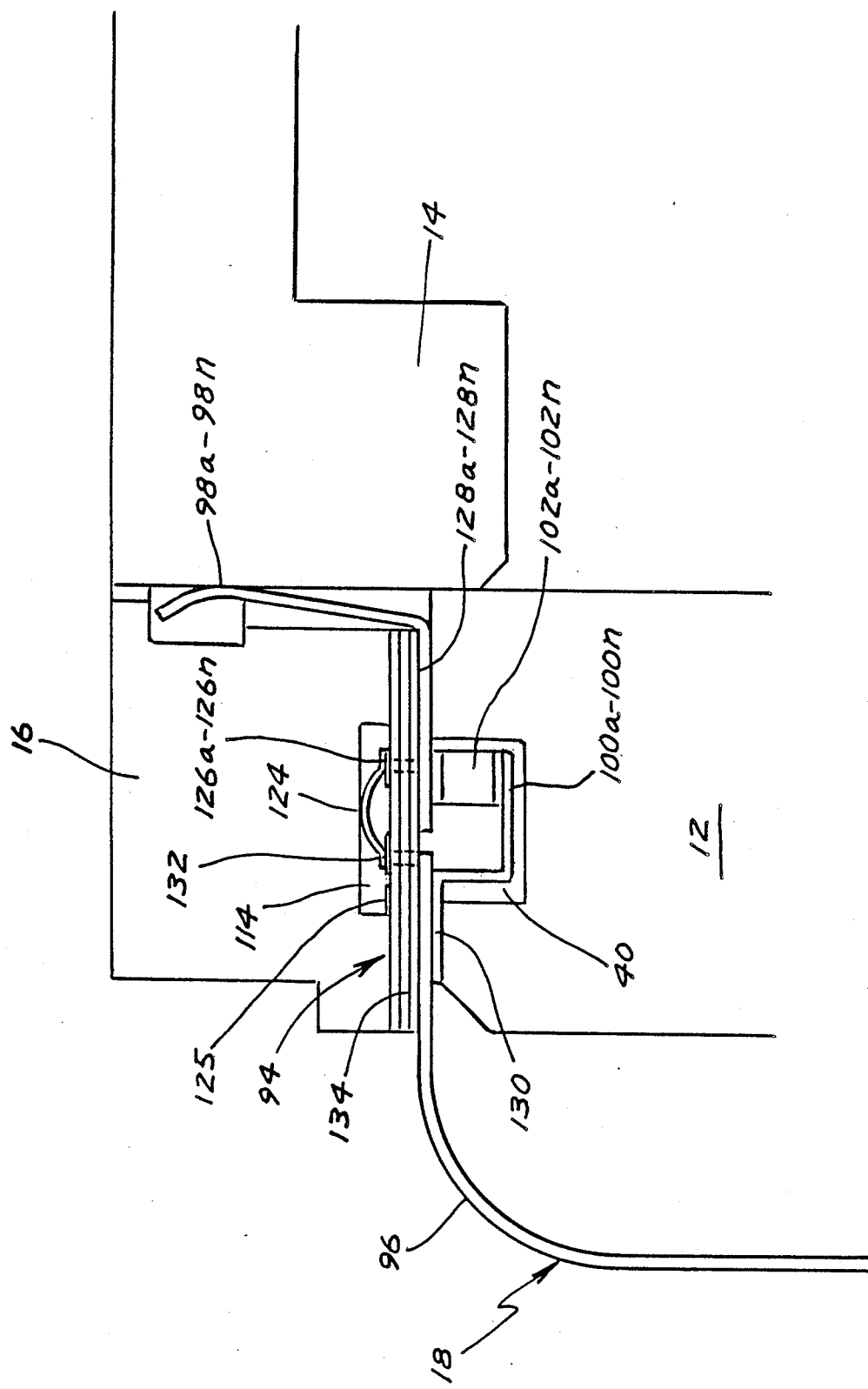
FIG. 5 illustrates a side view of the contact area.
Figure 8:
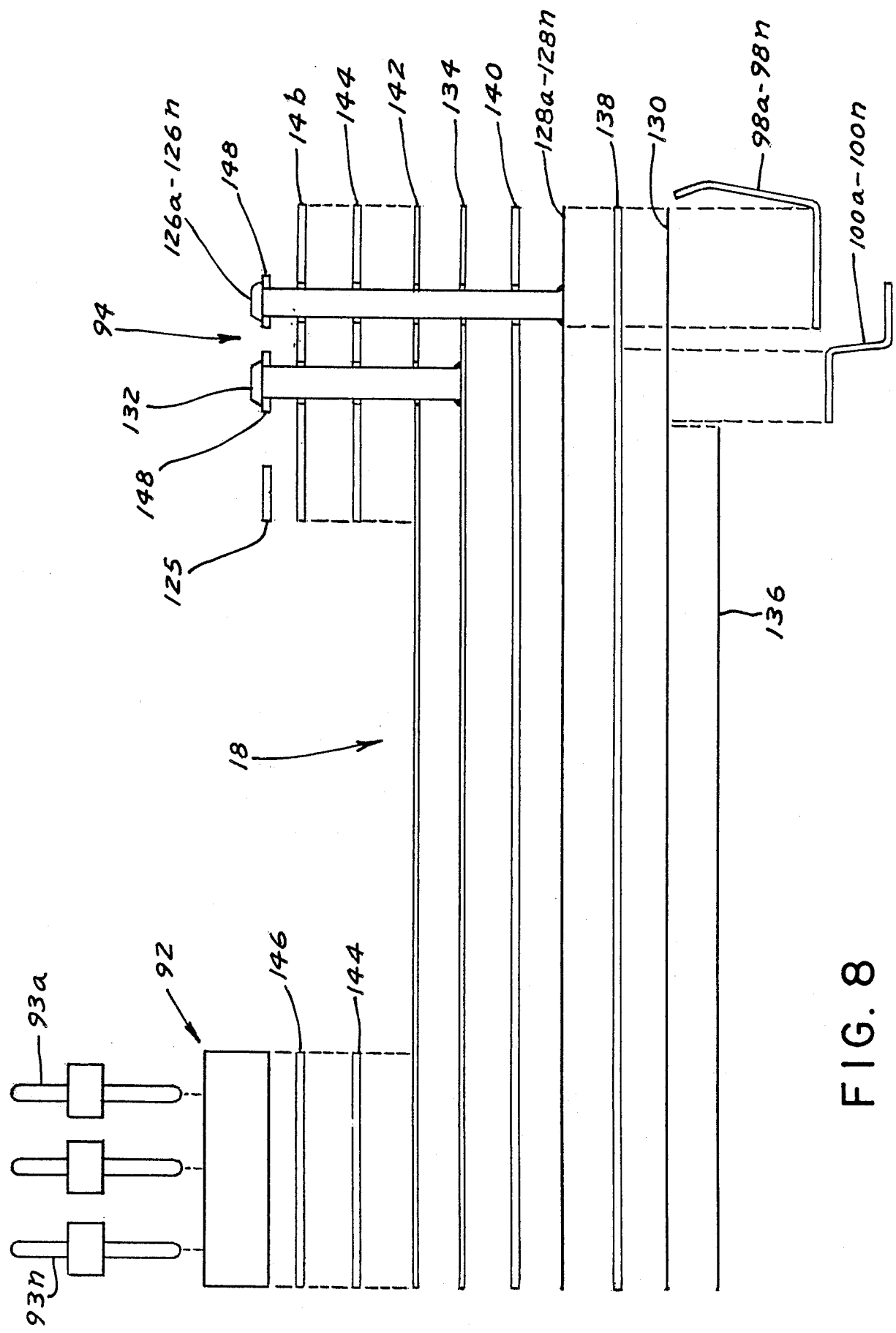
FIG. 8 illustrates an exploded view illustrating the material layers of the controlled impedance cable assembly.
Figure 9:
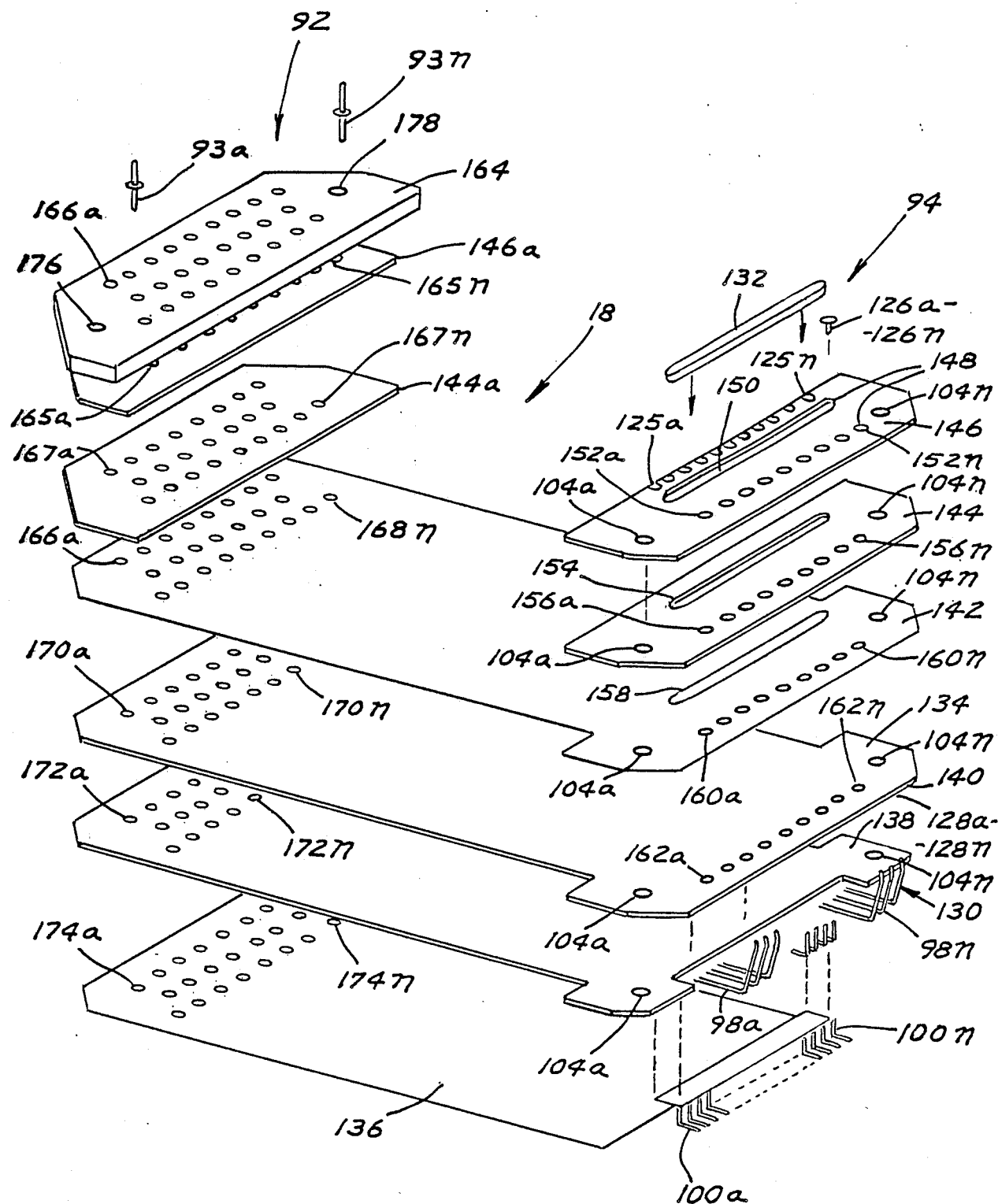
FIG. 9 illustrates an exploded view of the controlled impedance cable assembly.

FIG. 2 illustrates a cross section view of the assembled controlled impedance testsite with a partial view of an integrated circuit chip 89 in place and depressed for testing where all numerals correspond to those elements previously described. Shown in particular is the engagement of a plurality of integrated circuit chip pins 91a-91n against spring contactors 98a-98n subsequent to engagement of the ejector 14 and integrated circuit chip 89 within receptacle cavity 26. Spring 86 is compressed upon integrated circuit chip 89 and ejector 14 for engagement into receptacle cavity 26, and forceably ejects the integrated circuit chip 89 and the ejector 14 upwardly after testing for integrated circuit chip 89 removal from the controlled impedance testsite 10. Cross sections and exploded views of the upper connection block 94 and lower connection block 92 are illustrated in FIGS. 5, 8 and 9. Capacitors 102a-102n position between capacitor contactors 100a-100n and spring contactors 98a-98n, and connect through cable 96 to the lower connection block 92 and pins 93a-93n for connection to outboard test equipment. It is noted that bevels 56a-56d and 58a-58n may accommodate cables with shorter or lesser radii utilized for shorter cable lengths where smaller upper and lower cable connector blocks are used.

FIG. 3 illustrates a top view of the controlled impedance testsite with the top cover removed where all numerals correspond to those elements previously described. Shown in particular is the position capacitor cavities 40-46 adjacent to grooves 32a-32n, 34a-34n, 36a-36n, and 38a-38n in top extender top surfaces 32-38. The plane of the upper surfaces of mounting posts 60-66 is above the plane of extender top surfaces 32-38 to accommodate the upper connection board 94a for securement beneath cover 16, as also illustrated in FIG. 2.

FIG. 4 illustrates a top cutaway view of the controlled impedance testsite with the ejector, top cover and an integrated circuit chip in place and depressed for testing where all numerals correspond to those elements previously described. Cables 18-24 and respective connector boards 94a-94d are illustrated engaging over alignment pins 48a-48b, 50a-50b, 52a-52b, and 53a-53b on respective surfaces 32-38 on the upper portion of the extender 12. Cover 16 positions above and on the top of the cable connector boards 94a, 94b, 94c and 94d of cable assemblies 18-24 to fix and further align the connector boards 94a-94d around and about the upper periphery of the receptacle cavity 26 for subsequent engagement with integrated circuit chip pins 91a-91n.

Figure 11:
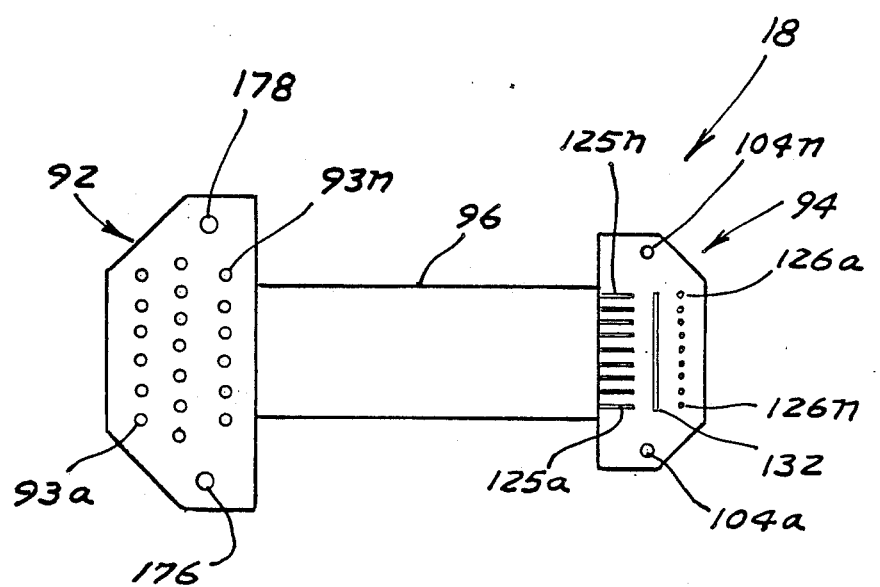
FIG. 11 illustrates a top view of a cable assembly.

FIG. 5 illustrates a side view of the upper contact board where all numerals correspond to those elements previously described. The upper contact board 94a, all parts of which are similar to contact board 94b, 94c, and 94d, engages between and is held in position by cover 16 and extender 12. A straight series of electrical signal pads 126a-126n, whose upper portions are solder dots, extend through contact block 94a to connect electrically to the bottom portion of spring contactors 98a-98n, respectively, and also to respective copper signal wires 128a-128n in cable 96 as also illustrated in FIGS. 4 and 11. Capacitors 102a-102n position between the bottom side of spring contactors 98a-98n and common based capacitor spring contactor 100a-100n. Common based capacitor contactors 100a-100n fix electrically to a flat copper flexible conductor sheet 130 in cable 96 to serve as a ground connection. A power pad 132 positions laterally across the contact board 94a and is fixed electrically to a flat flexible copper conductor board 94 where a jumper 124 may be used to connect power from power pad 132 to any of the electrical connector pads 126a-126n, as also illustrated in FIG. 4. Copper signal wires 128a-128n, flexible flat copper conductor ground plate 130 and the flexible flat copper power pad conductor 134, all being parts of cable 96, connect to pins 93a-93n in the lower connector board 92. A plurality of utility pads 125a-125n position on the upper surface of the connector block 94a adjacent to the power pad 132. An exploded view of the upper and lower contact boards 94 and 92 including insulation layers is illustrated in FIGS. 8 and 9.

Figure 6:
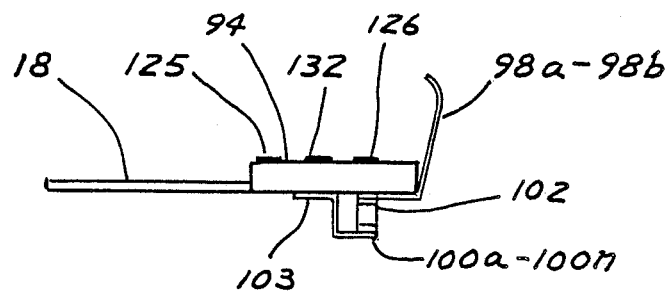
FIG. 6 illustrates a side view of the contact area.

FIG. 6 illustrates a side view of an upper contactor board where all numerals correspond to those elements previously described. Note in particular is the positioning of the spring contactors 98a-98b and capacitor contactors 100a-100n with reference to the capacitor 102 which is held between the horizontal portion of spring contactor 98 and capacitor contactor 100 by the spring qualities of the capacitor contactor 100.

Figure 7:
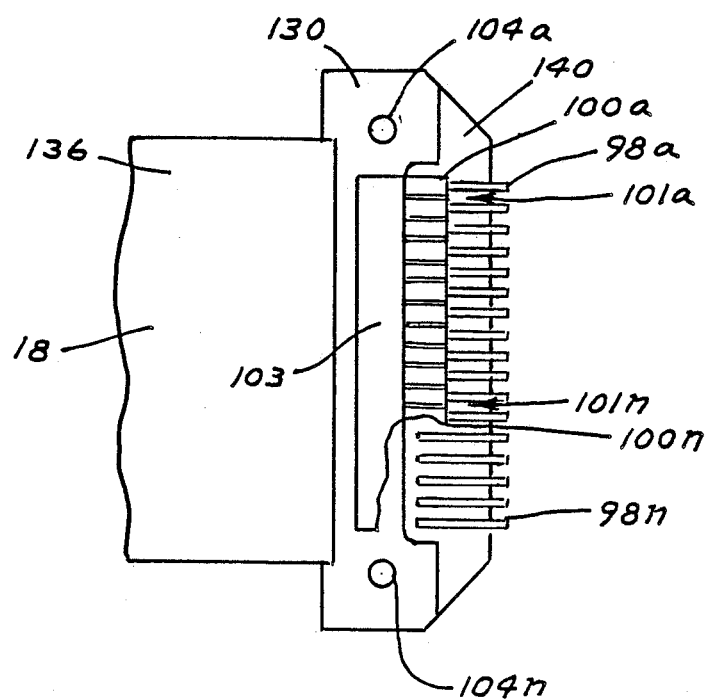
FIG. 7 illustrates a bottom view of the contact area.

FIG. 7 illustrates a bottom view of the upper contactor board 94 where all numerals correspond to those elements previously described. Shown in particular is the common capacitor base 103, capacitor contactors 100a-100n, and spaces 101a-101n which position between each of the contactors 100a-100n. A capacitor 102 or plurality of capacitors may be inserted individually between any sets of spring contactors 98a-98n and capacitor contactors 100a-100n without disturbing adjacent inserted capacitors.

FIG. 8 illustrates an exploded view of the material layers of controlled impedance cable assembly 18 where all numerals correspond to those elements previously described. As previously described flexible capacitor contactor copper sheet conductor 130, flexible power pad copper sheet conductor 134 and flexible copper signal wires 128a-128n position in cable 96 of cable assembly 18 wherein copper conductor members 128a-128n, 130 and 134 each position between various layers of Kapton as illustrated. Conductor member 130 positions between a 0.001" Kapton layer 136 and a 0.005" Kapton layer 138. The common based capacitor contactors 100a-100n position and electrically connect to the underside of conductor member 130. One-half ounce copper signal wires 128a-128n position between the 0.005" tact signal pads 126a-126n and contacts 98a-98n on one end and pins 93a-93n on the other end. Conductor member 134 positions between a 0.005" Kapton layer 140 and a 0.001" Kapton layer 142. The 0.005" Kapton layers 144 and 146 position to form the upper portion of the upper connector block 94. A one ounce copper printed circuit pad 148 positions on top of 0.005 Kapton pad 146 as a solder base for signal pads 126a-126n and power pad 132. Conductor member 134 connects electrically between power pad 132 and pins 93a-93n. The signal pads 126a-126n and power pad 132 are illustrated in this figure in a lengthened fashion for purposes of illustration. Each positions in respective insulating body holes in each respective layer as later described in FIG. 9. Pins 93a-93n position through lower connector block 92 and connect to conductor elements 130, 128a-128n and 134 as required for hookup to outboard integrated circuit testing connectors and circuitry. The Kapton insulating layers are used because of their desirable temperature characteristics and flexibility, but any similar insulating material may be used and the use of Kapton is not construed to be limiting to the scope of the invention.

FIG. 9 illustrates an exploded view of the layers of the controlled impedance cable assembly 18 where all numerals correspond to those elements previously described. Many of the elements of FIG. 9 include a plurality of co-located corresponding holes for accommodation of the elongated power pad 132, signal pads 126a-126n for the upper connector block 94 and for a plurality of pins 93a-93n in the lower connector block 92. Kapton layer 146 includes an elongated power pad hole 150 and a plurality of holes 152a-152n. Kapton layer 144 includes an elongated power pad hole 154 and a plurality of holes 156a-156n. Kapton layer 142 includes an elongated power pad hole 158 and a plurality of holes 160a-160n. Kapton layer 140 includes one ounce top copper layer 134 and one-half ounce bottom Kapton layer 128 as a unit, including holes 152a-152n. Lower connection block 92 likewise contains a plurality of co-located corresponding holes through its layers. The glass epoxy block 164, part of the lower connector block assembly 92, contains a plurality of geometrically alternated holes 166a-166n contained in three rows which correspond in like to the holes in the layers lying therebeneath. A Kapton layer 146a includes alternating holes 165a-165n correspond to holes 166a-166n. Another Kapton layer 144a includes alternating holes 167a-167n corresponding to holes 166a-166n. The 0.001" Kapton layer 142 includes alternating holes 168a-168n corresponding to holes 166a-166n. The one ounce copper layer 134, 0.005" Kapton layer 140 and underlying one-half ounce copper layer 128a-128n as a combined unit includes alternating holes 170a-170n corresponding to holes 166a-166n. The 0.005" Kapton layer 138 and the bottom one ounce layer 130 as a unit includes alternating holes 172a-172n corresponding to holes 166a-166n. The 0.001" Kapton layer 136 likewise includes alternating holes 174a-174n corresponding to holes 166a-166n. Holes 176 and 178 in the epoxy glass block 164 position to accept securement screws 106a-106n for fastening the lower connector board 92 into holes 180a and 180b in the extender 12. Holes 104a-104n position common in location through each layer of the upper contact board 94.

Figure 10:
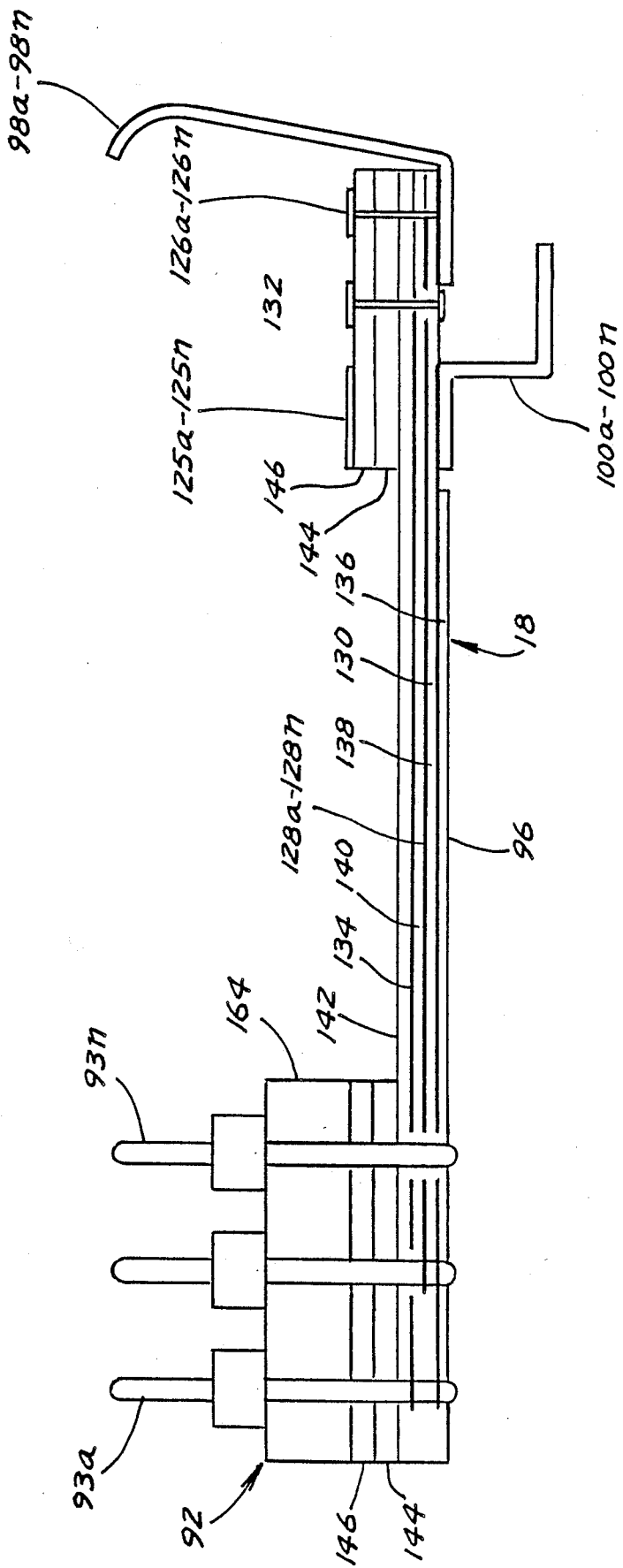
FIG. 10 illustrates a cutaway side view of a cable assembly.

FIG. 10 illustrates a cutaway view of a typical cable assembly 18 in a flattened or straightened out position where all numerals correspond to those elements previously described illustrating connection between the pins 93 and contact 98a-98n, signal pads 126a-126n, power pad 132, and capacitor contacts 100a-100n.

FIG. 11 illustrates a top view of a typical cable assembly 18 in a flattened position prior to installation in the controlled impedance testsite 10.

MODE OF OPERATION

Figure 12:
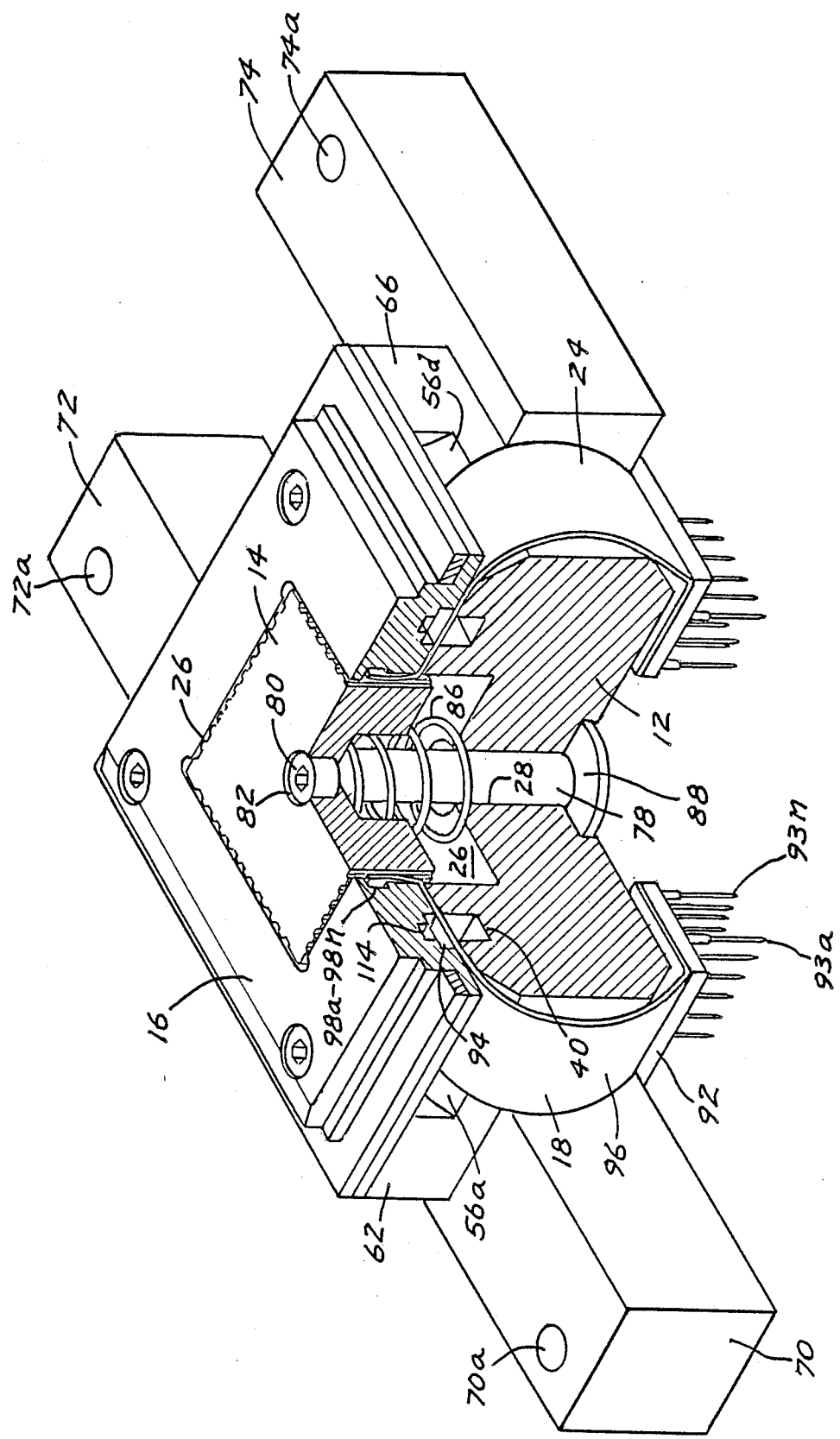
FIG. 12 illustrates a perspective view of the contactor.
Figure 13A:
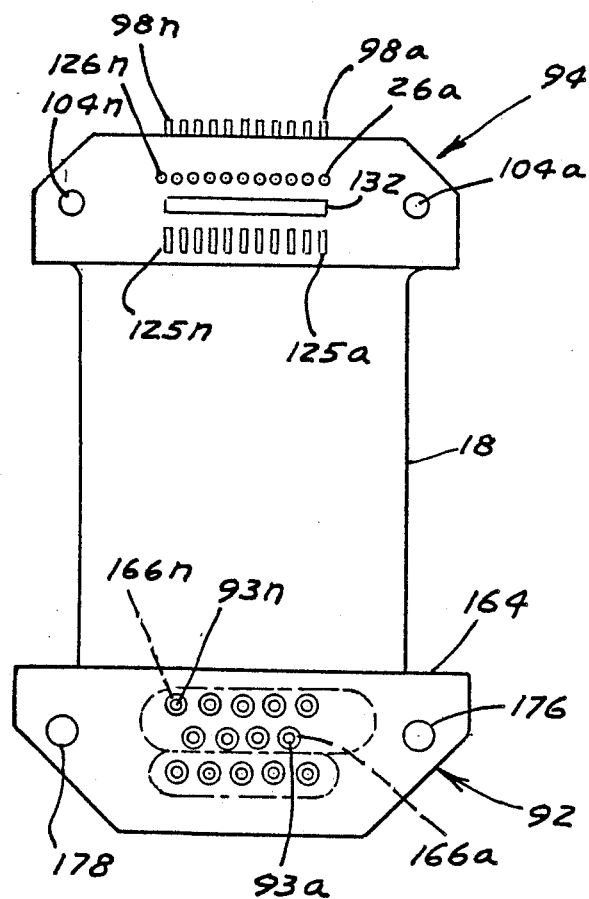
FIG. 13A and 13 illustrate top and bottom views of the cable.
Figure 13B:
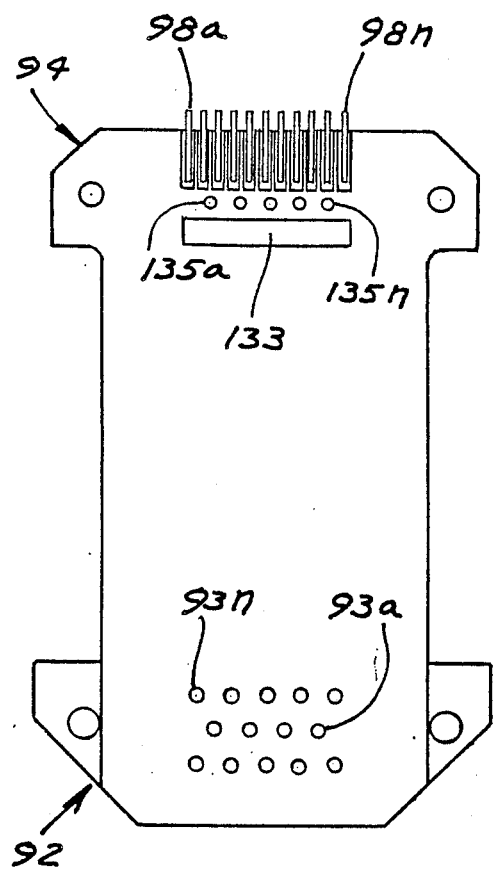
Figure 14:
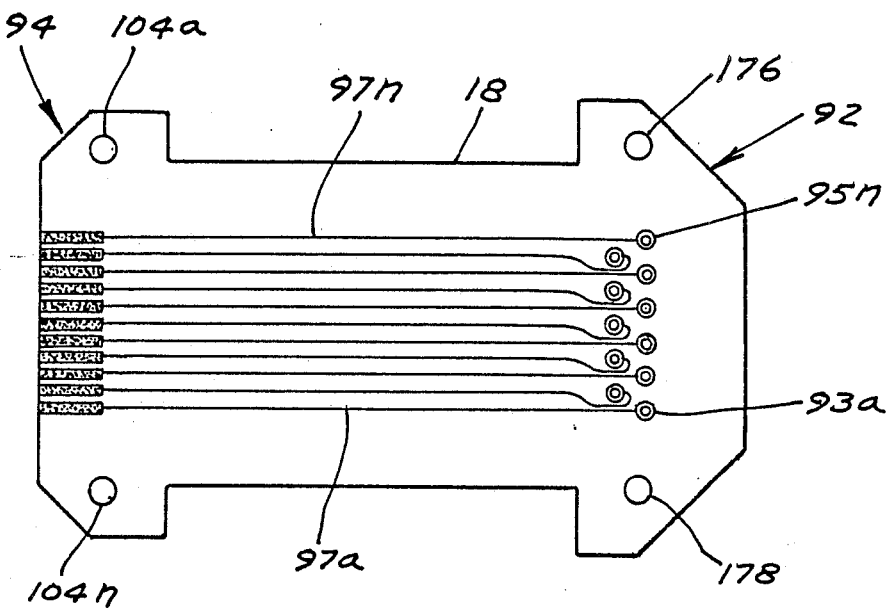
FIG. 14 illustrates a cross section of the cable.
Figure 15A:
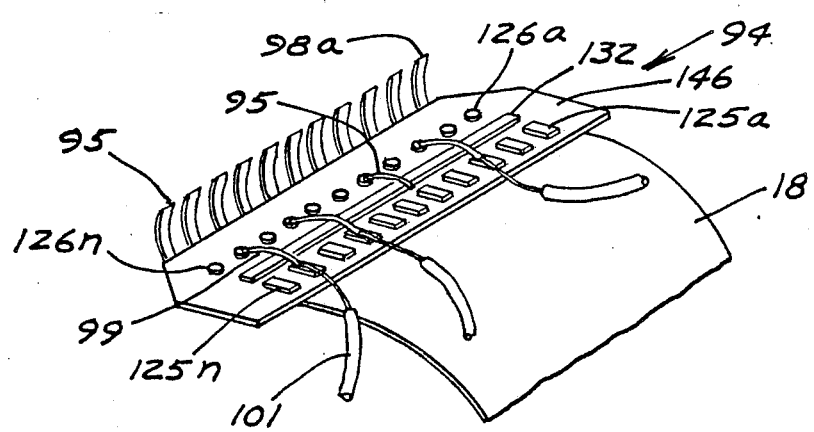
FIG. 15A–15C illustrate plan views of power pad connections to the cable.
Figure 15B:
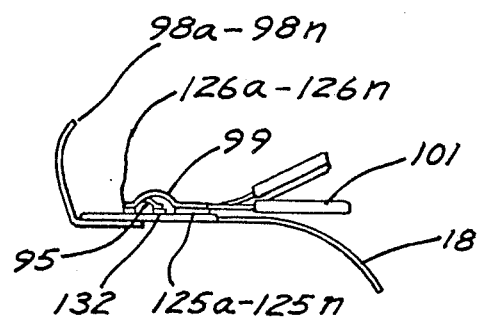
Figure 15C:
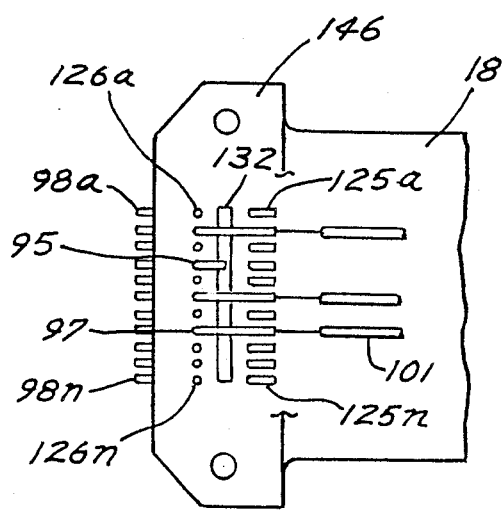
Figure 16A:
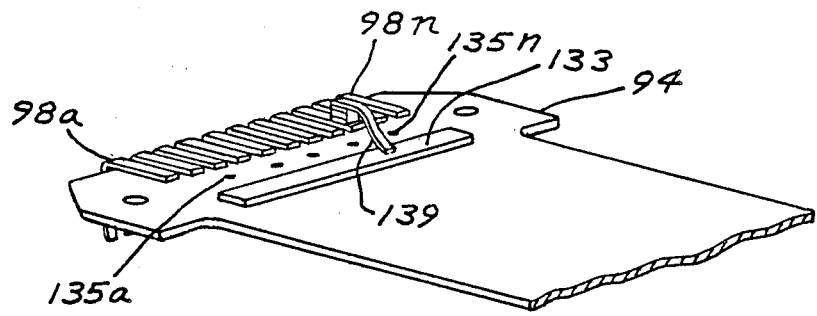
FIG. 16A–16C illustrate plan views of the decoupling to the cable.
Figure 16B:
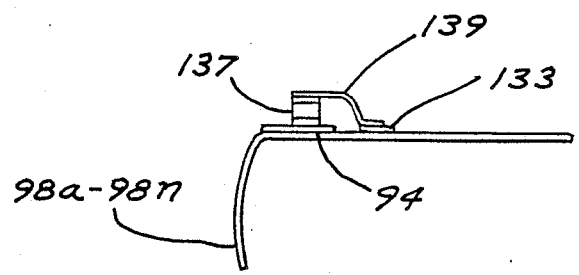
Figure 16C:
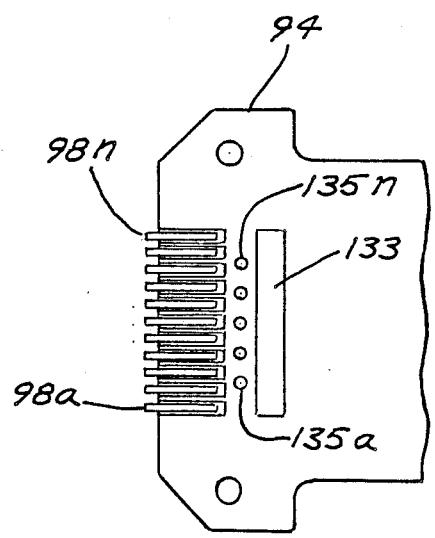

The high performance testsite includes the housing, the plunger, and the contactor. The housing is used to interface the contactor to the handler. The housing contains the wear plates and guide rails used to align the device for the plunger. The plunger is used to stop and align the device at the location. The contactor is made up of four main parts; the ejector button, the extender, the cover, and the controlled impedance cables as illustrated in FIG. 12. The ejector button guides the contacts and the IC device during insertion into the contactor. As the IC device is inserted into the contactor, the device pins make contact with the testsite before the ejector stops, and the insertion mode is complete. The ejector is spring returned to the original position after testing is complete. The extender is used as a bearing for the ejector shaft and as a mount for the controlled impedance cables. The hard board end of the cable mounts to the outside of the extender. The contact end of the cable is pinned to the inside of the extender. The cover clamps the contacts to the extender and protects the contacts as a device is inserted. The controlled impedance cables are a stripline type flexible Kapton circuit. This type of cable was selected because of the manufacturing variations possible and the environmental conditions the cable must undergo. This type of cable has been proven very reliable in the field of electronics under extreme environmental conditions. The top of this cable 18 contains the signal pads 126a-126n, power pad 132, utility pads 125a-125n hard board mount 94, and the Hyper-Tac connection pins 93a-93n as illustrated in FIG. 13A. The signal pads 126a-126n are connected directly to the signal traces 97a-97n and the contacts 98a-98n. The signal traces 97a-97n are terminated at the Hyper-Tac pins 93a-93n and the contacts 126a-126n. Each signal trace 97a-97n is consistent in length to within ±0.001 inches. This is done by wrapping what might be a short trace around the terminating pad to use up length as illustrated in FIG. 14. The power pad 132 is an extension of the power plane. This pad 132 can be used when a customer needs power to a pin or series of pins. By using a jumper wire 95, the customer can connect power to any contact as illustrated in FIGS. 15A-15C. This type of operation is referred to as a power bypass. The utility pads 125a-125n are not connected as these pads are used only as a solder pad for bypassing operations. The customer can now use their imagination for connecting power bypasses. Utility pads can be used to bypass several different current or voltage values at the same time as in FIG. 4. The user supplies an auxiliary power wire 101 to the utility pad 125a-125n. The jumper 99 from this utility pad to the signal pad 126a-126n makes the bypass complete. The number of different current or voltage values is limited only by the number of utility pads and power pads. The number of utility pads on a cable correlates to the number of contacts per cable. The hard board 92 is used to mount the cable to the extender and as a mount for the Hyper-Tac pins 93a–93n. The Hyper-Tac pins are soldered to the cable from the cable side of the hard board 92. On the opposite side of this cable, the contacts 98a–98n, ground pad 133, and power pads 135a–135n are positioned as illustrated, as also the solder joints of the Hyper-Tac pins 93a–93n. The contacts are formed from hardened flat wire stock Paliney 7. These are then soldered to the cable with high temperature solder. After forming, the contacts 98a–98n are silver plated to improve the electrical characteristics of the Paliney 7. Flat Paliney 7 contacts of this shape have been selected because of their simplicity and optimum deflection characteristics. The ground pad 133 is an extension of the ground plane. The ground plane is terminated at the tester DUT interfacing pins and ground pads. The ground pad 133 is used for decoupling of individual contacts (see FIG. 5A and B). Decoupling can be made by soldering a miniature ceramic chip capacitor 137 to and of the contacts 98a–98n, and then soldering a jumper wire to the ground pad 133. This operation can be done to any individual or series of contacts. The decoupling capacitor size is only limited by the package dimensions. Direct grounding of contacts can also be made with the ground pad (see FIG. 5C). The power pads 135a–135n can be used as an alternative to the power pad 132 on the opposite side of the cable. A power bypass can be made with these power pads as in FIG. 4.

FIG. 2 further illustrates the mode of operation. A PLCC 89 is inserted downwardly through cavities 108 and 112 in the cover 16 upon and against the ejector 14 and against the pressure of the spring 86. The PLCC contacts 91a–91n come into sliding contact with the spring contactors 98a–98n as the PLCC 89 descends downwardly upon the ejector 14. The descent of the PLCC 89 and the ejector 14 increasing by deflects the contactors 98a–98n until the descent of the PLCC 89 is stopped by engagement of the ejector 14 against surface 87 at the bottom of cavity 26. After testing downward pressure from handling machine is released and the ejector 14 and PLCC 89 are acted upon by the spring 86 to eject the PlCC 89 from the controlled impedance testsite 10.

High temperature characteristic ceramic chip capacitors 102a–102n can be inserted between the lower portions of the spring contactors 98a–98n and the capacitor contactors 100a–100n for individual PLCC pin decoupling as close as 0.2 inches of the PLCC pin. In the alternative, decoupling can also be made at user interfacing board. Any pin or series of pins can be decoupled. Individual pin grounding is also possible by using jumping wires. High voltage bypass to individual device pins is also possible when the voltage current exceeds the capability of individual signal traces by connecting jumper wires. Supplying of different voltages to different pins is also possible.

Contact replacement is facilitated by the use of similar sets of cables 18 whereby any one of the sets may be removed and replaced simply by removing the screws holding the cover 16 to the extender 12 and removing the upper connector board 94 from the upper surface of the extender 12 and by removing fasteners 106a–106b to remove the lower connector board 92 from the bottom surface of the extender 12. A replacement cable 18 is then replaced by reversing the above process.

DESCRIPTION OF THE ALTERNATIVE EMBODIMENTS

Figure 17:
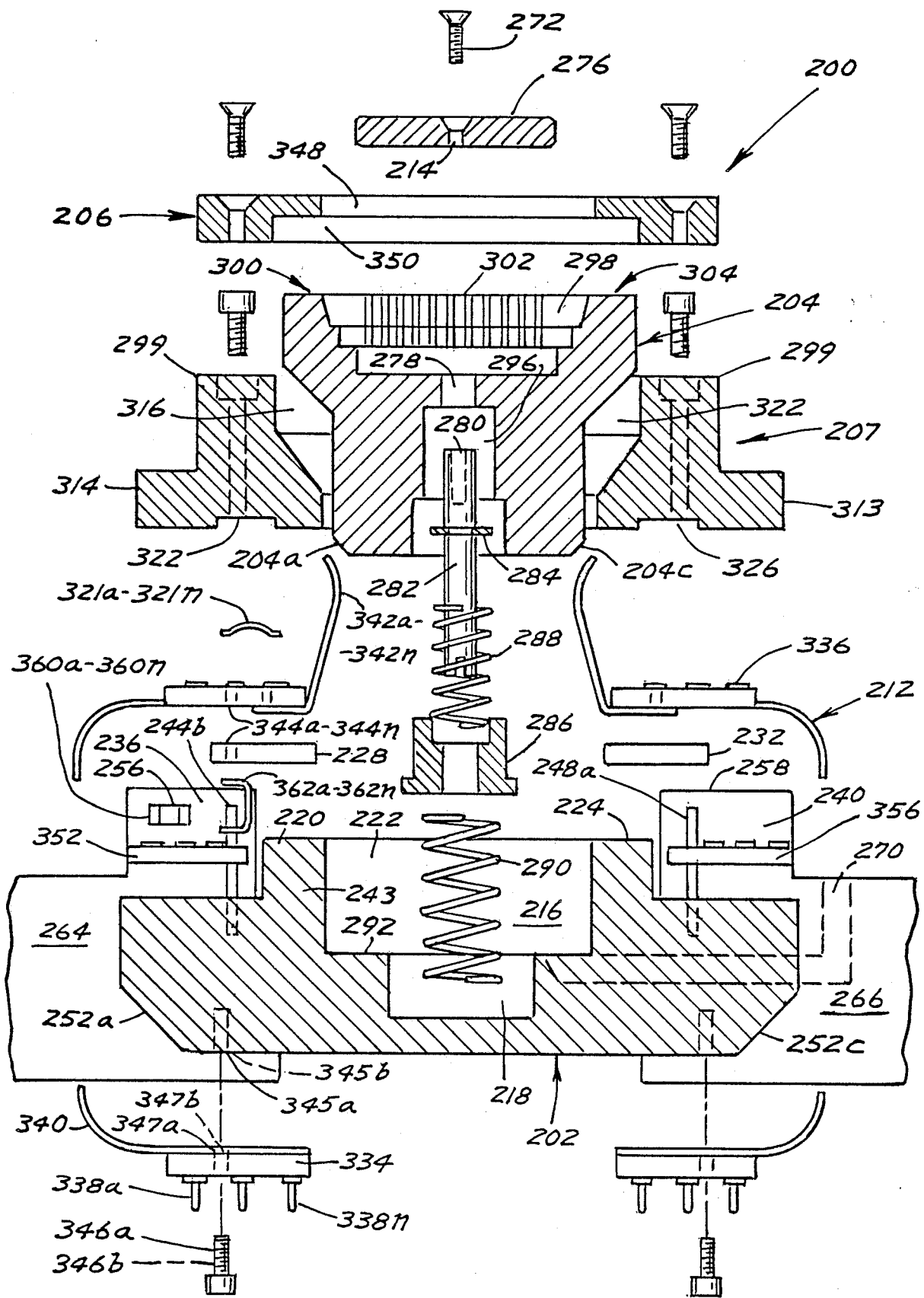
FIG. 17 illustrates an alternative embodiment in partial cross section of a controlled impedance testsite.

FIG. 17 illustrates an alternative embodiment in partial cross section of a controlled impedance testsite 200, the present invention, including a one-piece molded configured extender 202, an ejector 204, a cover 206, an upper housing 207, and controlled impedance cable assemblies 208 and 212. These components and other described components are referred to in FIG. 1 and also illustrated in the other figures.

Figure 19:
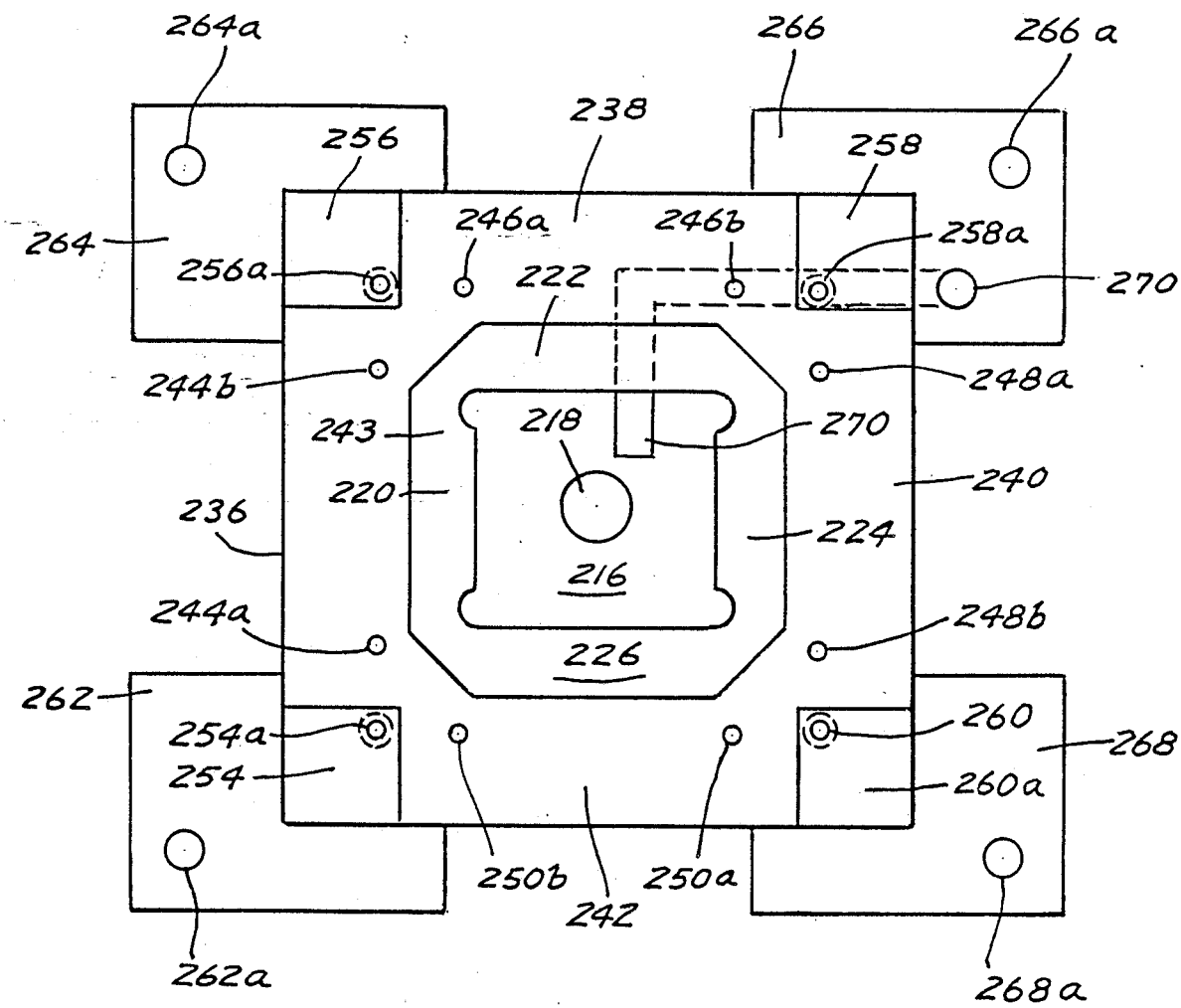
FIG. 19 illustrates a top view of the controlled impedance testsite with the ejector and top cover and upper housing removed.

The configured extender 202 includes a centrally located receptacle cavity 216. A spring retainer hole 218 centrally locates within the extender 202. The top portion of the spring retainer hole 218 positions centrally within the receptacle cavity 216. Top planar surfaces 220–226 position on the upper portion of a lip 243 of the extender 202 for alignment with contactor boards 228–234. Longitudinal capacitor recesses 236, 238, 240, and 242 position around lower perimeter of the extender lip 243 and include alignment pins 244a, 244b, 246a, 246b, 248a, 248b, 250a, and 250b, which position respectively in the capacitor recesses 236–242. Ramped surfaces 252a–252b are located at the lower outer sides of the extender 202 for facilitation of the controlled impedance cables 208–214 on each side of the controlled impedance testsite. Raised mounting posts 254, 256, 258 and 260, as also illustrated in FIG. 19, including threaded securement holes 254a, 256a, 258a and 260a for securing of the upper housing 207 to the extender 202 as shown in FIG. 19, position at each of the upper outer corners of the extender 202 and are raised above top surfaces 202–226 of the extender lip 243 to provide a space for securing and positioning of the upper portions of the controlled impedance cables 208–214 beneath the upper housing 207. Mounting flanges 262, 264, 266 and 268 position at the lower corners of the extender 202 and include body holes 254a, 256a, 258a, and 260a as whown in FIG. 10. A conditioned air channel 270 extends from the ejector receptacle cavity 216, through the extender 202, and into flange 266 for subsequent attachment to an air source for maintaining flow of conditioned air across an integrated circuit chip in the testsite 200.

Figure 18:
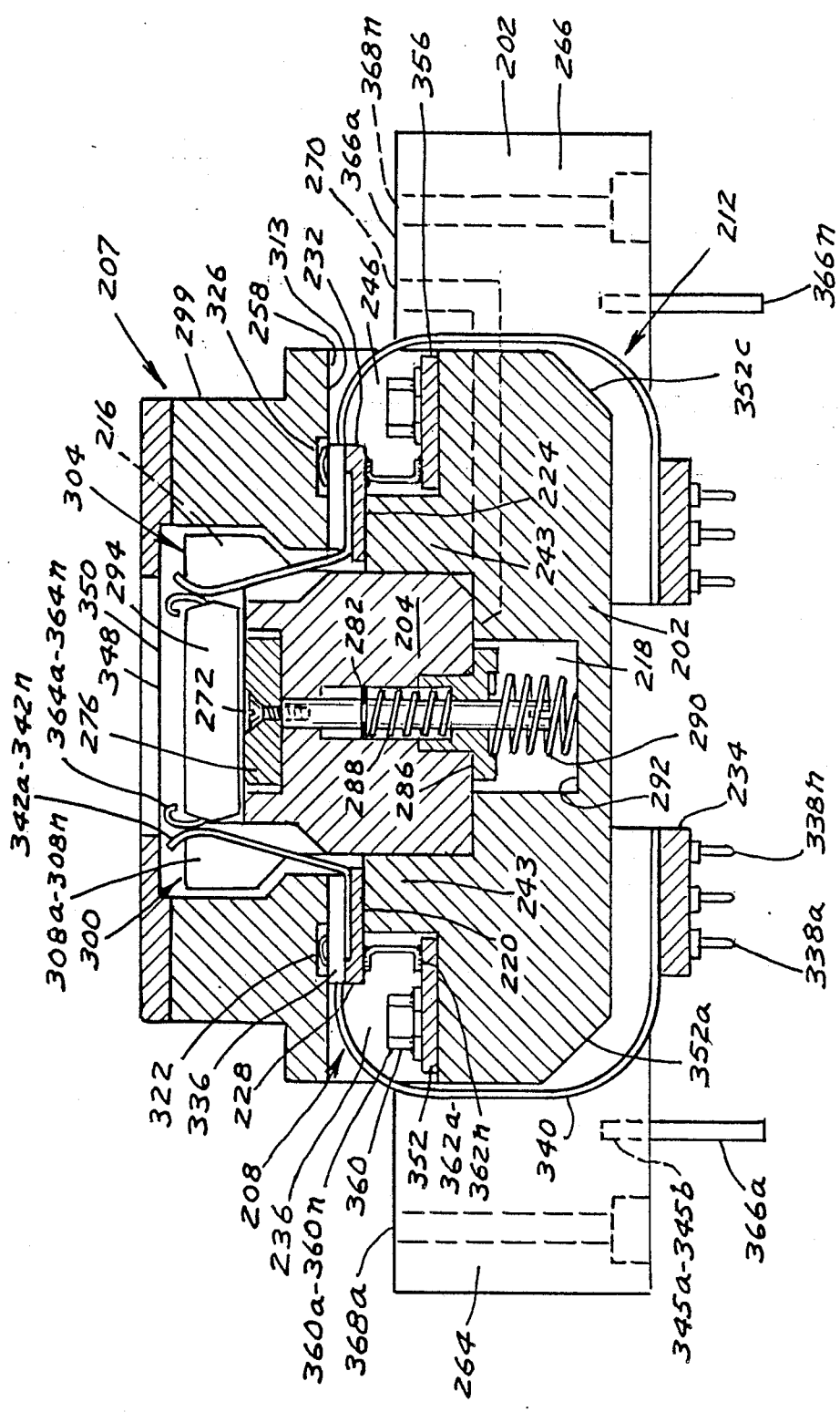
FIG. 18 illustrates a cross section of the controlled impedance testsite with an integrated circuit chip in place and depressed for testing.
Figure 21:
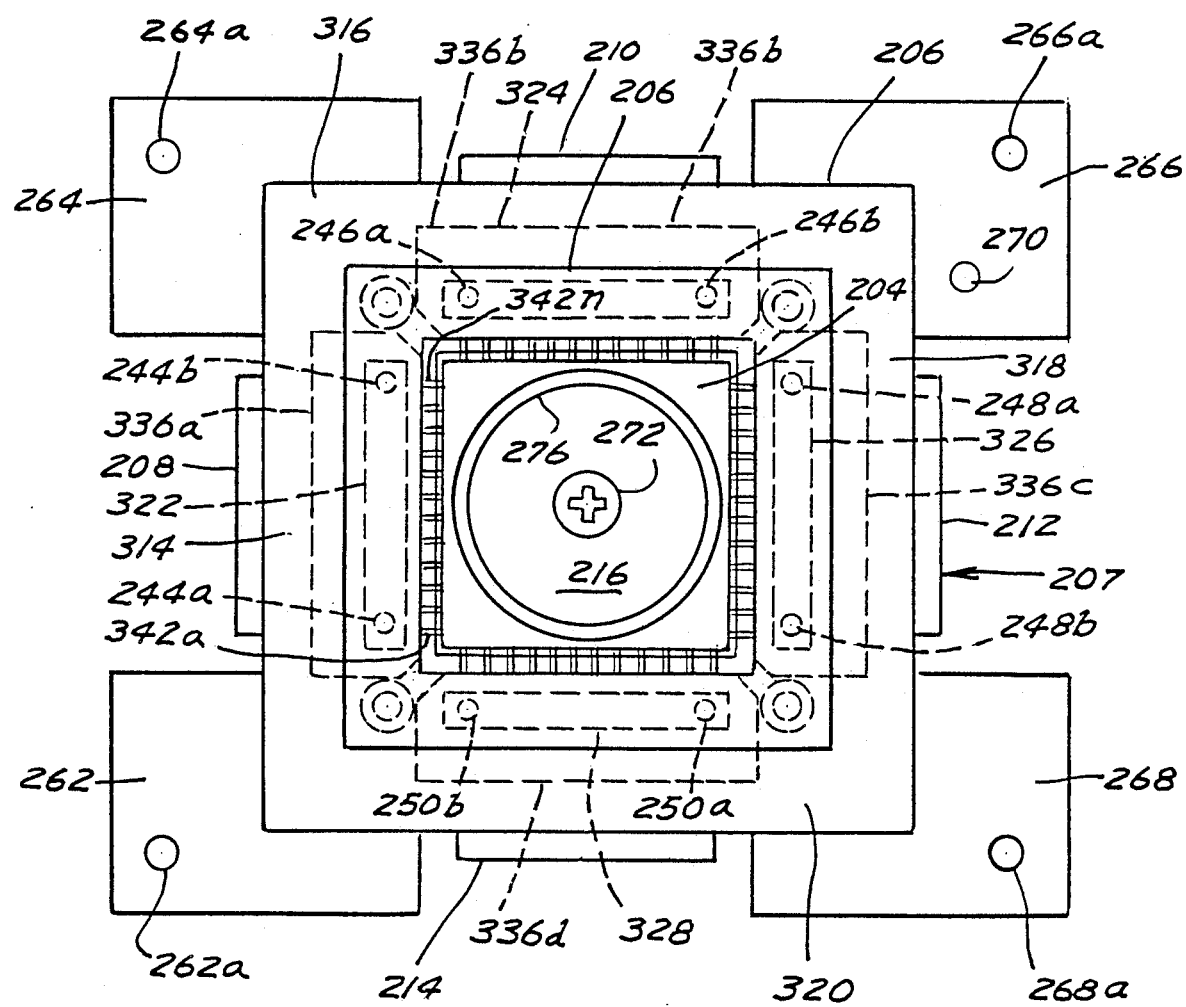
FIG. 21 illustrates a top view of a controlled impedance testsite.

An ejector 204 includes lower beveled edges 204a, 204b, 204c and 204d of which like and similar bevels 204a and 204c are illustrated. The ejector 204 fits within and traverses vertically within the ejector receptacle cavity 216. A machine screw 272 extends through a hole 274 in a keeper plate 276, through hole 278 in the ejector 204 and into a threaded hole 280 in the ejector shaft 282 to secure the ejector shaft 282 within the ejector 204. A spring retaining seat 284 and a dual spring seat retainer 286 affix over the ejector shaft 282. A spring 288 positions between the spring retainer seat 284 and the dual spring seat retainer 286, and another spring 290 positions over the ejector shaft 282 and between the dual spring seat retainer 286 and a surface 292 of the extender 202 to provide spring tension against the ejector 204 for ejection of an integrated circuit chip 294 of FIG. 18 from the controlled impedance testsite 200 after it has been tested. Ejector shaft 282, spring retainer seat 284, spring 288 and the upper portion of the dual spring seat retainer 286 align in a dual radius hole 296 in the lower portion of the ejector 204. A multilevel cavity 298 with beveled walls in the upper portion of the ejector 204 accommodates the keeper plate 276 and a IC 294. The upper portion of the ejector surrounding the multilevel cavity 298 includes a series of alternating divider members and spaces between the divider member along each of the four ejector sides 300-306. Side 300 is typical of sides 300-306 where each side includes similar elements including vertical divider members 308a-308n each having spaces 310a-310n separating the vertical divider members 308a-308n as also illustrated in FIG. 20. Spaces 310a-310n also accommodate spring contactors 342a-342n as illustrated in FIG. 18. The lower portions of the vertical divider members 308a-308n are beveled to fit within the inner beveled walls of the upper housing 207. The upper housing 207 accommodates the ejector 204 internally and a cover 206 externally. The upper housing includes housing elements 314, 316, 318, 320 and a lower planar surface 313 common to each of the housing elements 314, 316, 318 and 320. Surface 313 of the upper housing is secured over and about mounting posts 254-260 and over the upper portion of the controlled impedance cables 208-214, including connector boardS 336-342 to positionally secure the upper portion of the controled impedance cables 208-214 and contactor board 228-234 in a stacked fashion to the surfaces 220-226 of the extender 202. This also ensures electrical contact of the elements of the connector boards 336-342 to elements of the contactor boards 236-242. Cavities 322, 324, 326 and 328, also illustrated in FIG. 21 are located in the lower planar surface 313 of the housing elements 314-320 respectively to accommodate wire jumper pins 321a-321n which are soldered to contact pads on the upper connector board 336a of the controlled impedance cables 208 and like cables 210-214, as later described in detail. A lip 299, having particularly angled inner walls, at the upper portion of the ejector 204 surrounds a cavity 332 which is geometrically configured to accommodate the ejector 204.

Controlled impedance cables assemblies 208-214 position and extend about the sides of the extender 202 from a lower connector board 334 to an upper connector board 336 and includes contactor pins at both connector boards. For sake of clarity and brevity, only one controlled impedance cable 208 is described as the cables and connector boards are like and similar.

The controlled impedance cable assembly 208 includes a phenolic lower connector board 334 including a plurality of pins 338a-338n secured thereto, an upper connector board 336 and a cable assembly 340 similar to the cable assembly 18 described therebetween in detail in previous figures. A plurality of angled spring contactors 342a-342n is affixed on the underside of the upper connector board 336a. The spring contactors 342a-342n on the upper connector board 336a are brought into alignment with the extender block 202 and the ejector 204 by a series of alignment holes 344a-344b drilled through the entire connector board 336a and contactor board 228 as a unit which are placed over pins 244a-244b. The lower connector board 334 is secured into holes 345a-345b to the extender 202 by screws 346a and 345b positioned between holes 347a-347b in the lower connector board 334. The upper connector board 336 and associated components, secure beneath the upper housing 207 on top of extender block 202, over surface 220 of the extender, and between raised mounting platforms 254 and 256.

A top cover 206 includes a top cavity 348 and a four-sided pin top groove 350. A typical jumper pin 321a, by way of example and for purposes of illustration only, is shown for various interconnections of wire sets or pairs on the top surface contacts of the upper connector board 336a. The upper housing 207 secures to the extender 202 and the cover 206 secures to the upper housing using appropriate hardware as illustrated.

Bus boards 352, 354, 356 and 358 are located in capacitor recesses 236-242, respectively, for mounting of capacitors or other components or jumper wires on the bus boards 352-358 and for on site wiring between components such as a capacitor 360 or other electrical components for connection to each contactor board 228-234. A plurality of jumper pins 362a-362n are soldered between the bus boards 352-358 and contactor board 228-234, respectively, to effect an electrical connection therebetween to electrically connect any component such as a capacitor 360 to the spring contactors 342a-342n.

Figure 22:
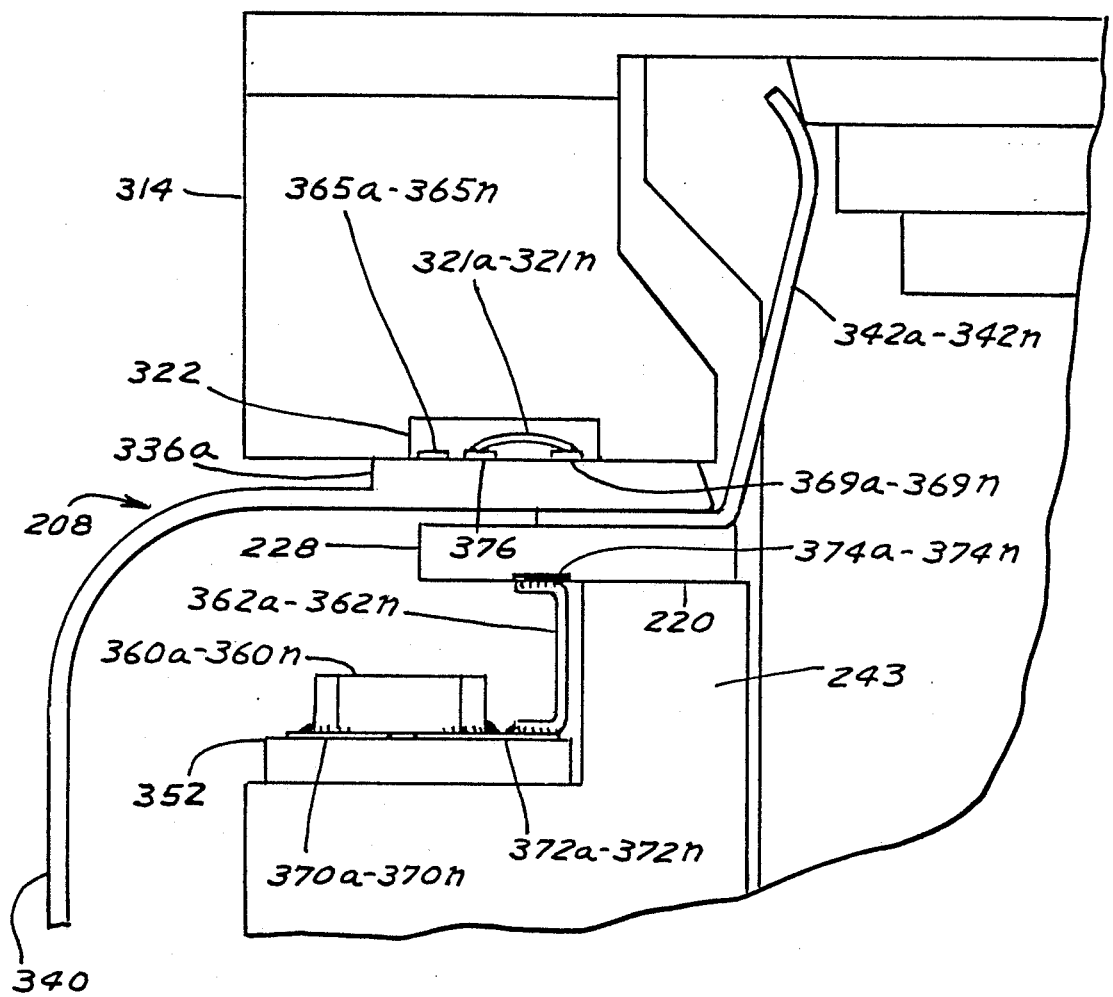
FIG. 22 illustrates the upper connector board, contactor board and bus board engaged in the controlled impedance testsite.

FIG. 18 illustrates a cross-sectional view of the assembled controlled impedance testsite 200 with a view of an integrated circuit chip 294 in place and depressed for testing where all numerals correspond to those elements previously described. Shown in particular is the engagement of a plurality of integrated circuit chip pins 364a-364n against spring contactors 342a-342n subsequent to engagement of the ejector 204 within the receptacle cavity 216 and integrated circuit chip 294 within the multi-level cavity 298. Springs 288 and 290 are compressed upon integrated circuit chip 294 and ejector 204 for engagement into the multi-level cavity 298 and receptacle cavity 216, and forceably eject the integrated circuit chip 294 upwardly and moves the ejector 202 upwardly after testing for integrated circuit chip 294 removal from the controlled impedance testsite 200. Cross-sectional side and bottom views of the upper connector block 336a, contactor board 228 and bus board 352 are illustrated in FIG. 22. Capacitors 360a-360n locate on the typical bus board 352, and connect through jumpers 352a-362n to a typical contactor board 228 and through cable assembly 340 to the lower connection block 334 and pins 338a-338n for connection to outboard test equipment. It is noted that ramped surfaces 252a-252d accommodate cables with shorter or lesser radii utilized for shorter cable lengths where smaller upper and lower cable connector blocks are used. Alignment pins 366a-366n extend from the extender 202 for alignment with external mounting devices. Holes 368a-368n locate in the extender 202 for securement to a test fixture mounting plate.

FIG. 19 illustrates a top view of the controlled impedance testsite 200 with the top cover 206, upper housing 207 and ejector 204 removed where all numerals correspond to those elements previously described. The plane of the upper surfaces of mounting posts 254-258 is above the plane of top surfaces 220-226 to accommodate the typical upper connector board 336a and the contactor board 228 for securement beneath the upper housing 207, as also illustrated in FIG. 18.

FIG. 20 illustrates a top view of the ejector 204 where all numerals correspond to those elements previously described. Shown in particular is the side 300 including a plurality of typical dividers 308a-308n with interceding spaces 310a-310n. Sides 302-306 are similar to side 300 where each includes a similar plurality of dividers with interceding spaces.

FIG. 21 illustrates a top view of the controlled impedance testsite with the ejector 204, upper housing 207 and top cover 206 in place for testing where all numerals correspond to those elements previously described. Cables 208-214 and respective connector board 336a–336d are illustrated engaging over alignment pins 244a–244b, 246a–246b, 248a–248b, and 250a–250b of the extender 202. The upper housing 207 positions above and on the top of the cable connector boards 336a–336d and of cable assemblies 208–214 to fix and further align the connector board 336a–336d around and about the upper periphery of the receptacle cavity 216 for subsequent engagement with integrated circuit chip pins 364a–364n and other illustrated like and similar integrated circuit chip pins similar to and aligned in a corresponding manner as pins 364a–364n.

FIG. 22 illustrates a side view of the upper connector board 336a engaged between housing element 314 and contactor board 228 where all numerals correspond to those elements previously described. The upper connector board 336a, all parts of which are similar to connector boards 336b, 336c and 336d, engages between and is held in position by the housing element 334 and or the contactor board 228 which rests on surface 220 of the lip 243. A plurality of electrical signal pads 369a–369n, whose upper portions are solder dots, extend through connector board 336a to connect electrically to the bottom portion of spring contactors 342a–342n, respectively, and also to respective copper signal wires in cable assembly 340. Capacitors 360a–360n position between the solder pads 370a–370n and 372a–372n on the bus board 352 and jumper pins 362a–362n position between solder pads 372a–372n and solder pads 374a–347n on the contactor board 228. A power pad 376 positions laterally across the connector board 336a where jumpers 321a–321n may be used to connect power from power pad 376 to any of the electrical connector pads 369a–369n and subsequently to spring contactors 342a–342n. A plurality of utility pads 365a–365n position on the upper surface of the upper connector board 336a adjacent to the power pad 376. Wire leads from the power pad 376 and utility pads 365a–365n pass through the controlled impedance cable 208 in a similar fashion as previously described in FIG. 5.

Figure 23:
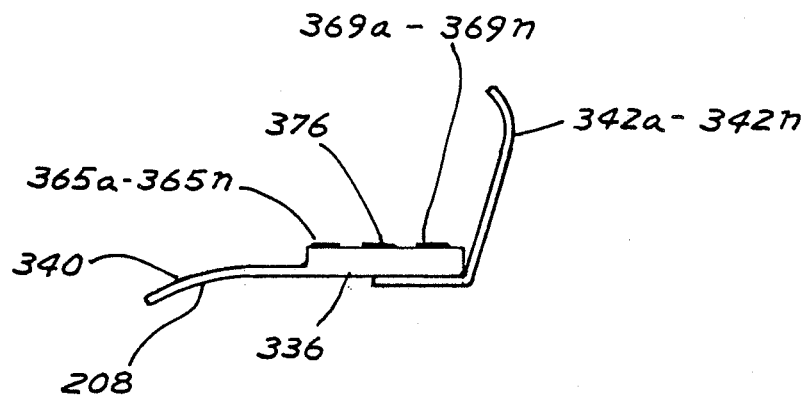
FIG. 23 illustrates a side view of the upper connector board.

FIG. 23 illustrates a side view of an upper contactor board where all numerals correspond to those elements previously described.

Figure 24:
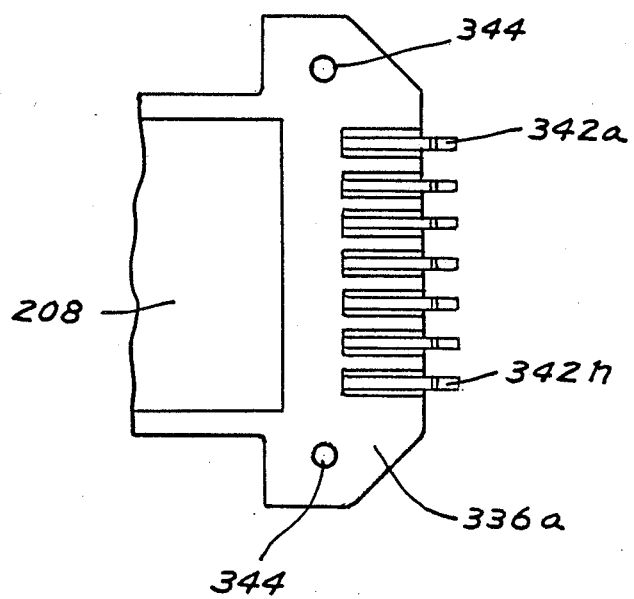
FIG. 24 illustrates a bottom view of the upper connector board.

FIG. 24 illustrates a bottom view of the connector board 336a where all numerals correspond to those elements previously described.

Various modifications can be made to the present invention without departing from the apparent scope thereof.

I claim:

1. A controlled impedance testsite comprising:
    a. a housing therein including a receptacle cavity in an extender, a spring shaft hole in said extender, a spring shaft engaged in said spring shaft hole, a spring engaged about said spring shaft and between an ejector and said extender, a plurality of capacitor cavities with alignment pins in the top surface of said extender, a plurality of mounting flanges about said extender, and a plurality of alignment grooves in the top surface of said extender; and,
    b. a plurality of controlled impedance cables connecting between the top surface and the bottom surface of said extender, a top connector board and a bottom connector board positioned on each end of said cables, said top connector board including a spring contactor, a capacitor contactor, a plurality of power pads, a plurality of signal pads and a plurality of utility pads, said top connector board connected to said bottom connector board by layers of alternating conductors and insulators, said bottom board including connector pins for connection to external test equipment, and said power pads and said signal pads on said top connector board electrically connected to said pins in said bottom connector board.

2. A controlled impedance testsite of claim 1 further comprising a device pin decoupling means having a high temperature characteristic ceramic capacitor between said spring contact and said capacitor connection at one end of the controlled impedance cable.

3. A controlled impedance testsite of claim 1 wherein any pin or series of pins in the bottom connector board are grounded by respective jumper wires.

4. A controlled impedance testsite of claim 1 wherein all of said controlled impedance cables have the same length.

5. A controlled impedance testsite of claim 1 further comprising wire jumpers connecting high current flows through cable wires.

6. A controlled impedance testsite of claim 1 wherein wire jumpers provide voltage distribution to any pins.

7. A controlled impedance testsite of claim 1 wherein replacement of any required contacts or pins is accomplished by replacement of a controlled impedance cable.

8. A controlled impedance testsite of claim 1 further comprising a cover which secures said top connector board, said connector pins and said capacitor contactors to said testsite.

9. A controlled impedance testsite of claim 1 wherein said spring contactors and said capacitor contactors secure to said top connector board as a unit.

10. A controlled impedance testsite of claim 1 further comprising ceramic chip capacitors and temperature resistant insulation placed between the cable conductors.

* * * * *